(12) United States Patent
Baretz

(10) Patent No.: US 12,087,889 B1
(45) Date of Patent: Sep. 10, 2024

(54) WHITE LIGHT LED WITH RUBIDIUM VAPOR EMISSION IN NESTED ENCLOSURE OPTIMIZING HUMAN VISION AND HORTICULTURAL PIGMENT IRRADIANCE

(71) Applicant: Bruce H Baretz, Montclair, NJ (US)

(72) Inventor: Bruce H Baretz, Montclair, NJ (US)

(*) Notice: Subject to any disclaimer, the term of this patent is extended or adjusted under 35 U.S.C. 154(b) by 0 days.

(21) Appl. No.: 18/600,348

(22) Filed: Mar. 8, 2024

Related U.S. Application Data

(60) Provisional application No. 63/491,793, filed on Mar. 23, 2023.

(51) Int. Cl.
  *H01L 33/50* (2010.01)
  *C09K 11/55* (2006.01)

(52) U.S. Cl.
  CPC ............ *H01L 33/504* (2013.01); *C09K 11/55* (2013.01); *H01L 33/507* (2013.01)

(58) Field of Classification Search
  CPC ...... H01L 33/504; H01L 33/507; C09K 11/55
  See application file for complete search history.

(56) References Cited

U.S. PATENT DOCUMENTS

| | | | |
|---|---|---|---|
| 2,007,927 A | 7/1935 | Braselton | |
| 5,132,589 A | 7/1992 | Friedman | |
| 6,600,175 B1* | 7/2003 | Baretz | H01L 33/50 257/E33.059 |
| 8,545,722 B2 | 10/2013 | Schmidt | |
| 8,780,948 B2 | 7/2014 | Wilkinson | |
| 8,963,182 B2 | 2/2015 | Baretz | |
| 10,158,052 B2 | 12/2018 | Weiler | |
| 10,573,791 B2 | 2/2020 | Haley | |

(Continued)

FOREIGN PATENT DOCUMENTS

| | | |
|---|---|---|
| AT | 505470 B1 | 9/2010 |
| CA | 2077003 | 2/1993 |

(Continued)

OTHER PUBLICATIONS

Barta DJ, Tibbitts TW, Bula RJ, Morrow RC; "Evaluation of light emitting diode characteristics for a space-based plant irradiation source." Adv Space Res. 1992;12(5):141-9. [Barta, et. al., 1992-A].

(Continued)

*Primary Examiner* — Mark W Tornow

(57) ABSTRACT

Chlorophyll a absorbs violet (high-energy; max. 372 nm) and orange light (low-energy; max. 642 nm) the most; the mid-point being 507 nm. Chlorophyll b absorbs mostly blue (high energy; max. 392 nm) and yellow (low-energy; max. 626 nm) light; the mid-point being 509 nm. They both also absorb light of other wavelengths with less intensity. Both mid-points are nearly identical to the mid-point between energy and entropy maximum of scattered sunlight. The claimed microelectronic device provides radiation for artificial lighting applications from ruthenium vapor in the blue and deep red region. The entropy (heat) generated by inefficiencies in p-n junction recombination and luminescent materials' Stokes shift is transferred to the thermodynamic heats of evaporation and sublimation of rubidium atoms. The microelectronic device eliminates the need for external cooling of indoor greenhouse environments used for growth of crops under continuous artificial lighting.

20 Claims, 6 Drawing Sheets

(56) References Cited

U.S. PATENT DOCUMENTS

| | | | |
|---|---|---|---|
| 10,957,827 | B2 | 3/2021 | Baretz |
| 11,114,592 | B2 | 9/2021 | Baretz |
| 11,158,768 | B2* | 10/2021 | Baretz ............... H01L 33/56 |
| 11,217,733 | B2 | 1/2022 | Baretz |
| 11,355,676 | B2 | 6/2022 | Baretz |
| 11,495,719 | B2 | 11/2022 | Baretz |
| 11,698,419 | B2 | 7/2023 | Garber |
| 2005/0062684 | A1* | 3/2005 | Geng ............... G09G 3/002 345/32 |
| 2005/0253502 | A1* | 11/2005 | Gokturk ............... C09K 11/66 313/503 |
| 2009/0289728 | A1 | 11/2009 | Ben-Aroyo |
| 2022/0029064 | A1 | 1/2022 | Baretz |
| 2023/0106866 | A1 | 4/2023 | Baretz |

FOREIGN PATENT DOCUMENTS

| | | |
|---|---|---|
| CA | 2301197 | 2/1999 |
| CA | 3038084 | 3/2018 |
| CA | 3149511 A1 | 8/2023 |
| DE | 626049 C | 2/1936 |
| WO | 2017001261 | 1/2017 |

OTHER PUBLICATIONS

Steranka, F. M. Chapter 3 AlGaAs Red Light-Emitting Diodes, Editor(s): Stringfellow, G.B. & George Craford, M., "Semiconductors and Semimetals", Elsevier, vol. 48, 1997, pp. 65-96. [Steranka, 1997.].

Holonyak Jr., N., & Bevacqua, S. F. (1962). "Coherent (visible) light emission from Ga (As1-x P x) junctions." Applied Physics Letters, 1(4), 82-83. [Holonyak Jr. et. al., 1962.].

McCree, K.J. "The action spectrum, absorptance and quantum yield of photosynthesis in crop plants", Agricultural Meteorology, vol. 9, 1971, pp. 191-216. [McCree, 1971.].

Vernon, L.P. and Seely, G.R. (Eds.), "The chlorophylls", Academic Press, New York 1966. [Vernon, et. al., 1966.].

[000204] Lysenko, V., Varduny, T., Simonovich, E., Chugueva, O., Chokheli, V., Sereda, M., Gorbov, S., Krasnov, V., Tarasov, E., Sherstneva, I., and Kozlova, M. (2014). "Far-Red Spectrum of Second Emerson Effect: A Study Using Dual-Wavelength Pulse Amplitude Modulation Fluorometry." American Journal of Biochemistry and Biotechnology. 10. 234-240. [Lysenko, et. al., 2014.].

Hoenecke M.E., Bula R.J., and Tibbitts T.W.; "Importance of 'blue' photon levels for lettuce seedlings grown under red-light-emitting diodes." HortScience. May 1992; 27(5):427-30 . . . [Hoenecke, et. al., 1992.].

Bula R.J., Morrow R.C., Tibbitts T.W., Barta D.J., Ignatius R].W., and Martin T.S.; "Light-emitting diodes as a radiation source for plants"; HortScience. Feb. 1991;26(2):203-5. [Bula, et. al . . . .

Janda M, Navrátil O, Haisel D, Jindřichová B, Fousek J, Burketová L, Čeřovská N, and Moravec T; "Growth and stress response in Arabidopsis thaliana, Nicotiana benthamiana, Glycine max, Solanum tuberosum and Brassica napus cultivated under polychromatic LEDs"; Plant Methods. Apr. 3, 20150. [Janda, et. al., 2015.].

Cope KR, Bugbee B., Spectral effects of three types of white light-emitting diodes on plant growth and development: absolute versus relative amounts of blue light. HortScience Publication Am Soc Horticultural Sci. 2013;48:504-9. [Cope et. Al., 2013].

Folta KM, Maruhnich SA., Green light: a signal to slow down or stop. J Exp Bot. 2007; 58:3099-111. [Folta, et. al., 2007].

Thekla Von Bismarck, Kübra Korkmaz, Jeremy Ruß, Kira Skurk, Elias Kaiser, Viviana Correa Galvis, Jeffrey A. Cruz, Deserah D. Strand, Karin Köhl, Jürgen Eirich, Iris Finkemeier, Peter Jahns, David M. Kramer, Ute Armbruster. Light acclimation interacts with thylakoid ion transport to govern the dynamics of photosynthesis in Arabidopsis. New Phytologist, 2022; 237. [von Bismarck et. al., 2022].

Wang C, Yamamoto H, Narumiya F, Munekage YN, Finazzi G, Szabo I, Shikanai T. Fine-tuned regulation of the K+ /H+ antiporter KEA3 is required to optimize photosynthesis during induction. Plant J. Feb. 2017;89 (3):540-553. [Wang, 2017.].

Mitchell, C. A. (2015). Academic Research Perspective of LEDs for the Horticulture Industry, HortScience, 50(9), 1293-1296. Retrieved Jan. 7, 2023, [Mitchell, 2015].

Von Lintig J, Kiser PD, Golczak M, Palczewski K. "The biochemical and structural basis for trans-to-cis isomerization of retinoids in the chemistry of vision." Trends Biochem Sci. Jul. 2010;35(7):400-10. [von Lintig, et. al., 2010.].

Cai X, Conley SM, Naash MI. RPE65: role in the visual cycle, human retinal disease, and gene therapy. Ophthalmic Genet. Jun. 2009;30(2):57-62. [Cai, et. al., 2009.].

Kim SR, Fishkin N, Kong J, Nakanishi K, Allikmets R, Sparrow JR. Rpe65 Leu450Met variant is associated with reduced levels of the retinal pigment epithelium lipofuscin fluorophores A2E and iso-A2E. Proc Natl Acad Sci U S A. Aug. 10, 2004;101(32):11668-72. [Kim, et. al.].

Curtis, S., "Cosmic Alchemy", Scientific American, Jan. 2023, p. 30. [Curtis, 2023.].

S. Millman and M. Fox, Nuclear Spins and Magnetic Moments of Rb 85 and Rb 87, Phys. Rev. 50, 220 (1936). [Millman, et. al., 1936].

Fahey, Donald & Noel, Michael. (2011). Excitation of Rydberg states in rubidium with near infrared diode lasers. Optics express. 19. 17002-12. [Fahey, et. al., 2011].

Sansonetti, J.E., "Wavelengths, Transitions Probabilities, and Energy Levels for the Spectra of Rubidium (Rb I through Rb XXXVII)"; J. Phys. Chem. Ref. Data, vol. 35, No. 1, 2006; p. 301. [Sansonetti, 2006].

Jackson, D.A., The Hyperfine Structure of the Lines of the Arc Spectrum of Rubidium, Proceedings of the Royal Society of London. Series A, Containing Papers of a Mathematical and Physical Character vol. 139, No. 839 (Mar. 3, 1933), pp. 673-682 [Jackson, 1933].

Julien Kluge, "Direct Optical Spectroscopy of the 6P manifold in rubidium", submitted Sep. 25, 2019 Sep. 25, 2019 to the Humboldt-Universitat zu Berlin, Faculty of Mathematics and Natural Sciences, Department of Physics. [Kluge, 2019].

Nakajima, T., Isobe, M., Tsuchiya, T. et al. Direct fabrication of metavanadate phosphor films on organic substrates for white-light-emitting devices. Nature Mater 7, 735-740 (2008). [Nakajima, et. al., 2008].

Na Wu, Yue Zhai, Peng Chang, Hang Mei, Ziyan Wang, Hong Zhang, Qiangqiang Zhu, Pei Liang and Le Wang. Rubidium ions doping to improve the photoluminescence properties of Mn doped CsPbCl3 perovskite quantum dots, 2023 Nanotechnology 34 145701. [Na Wu, et. al., 2023].

Niedzwiedzki, D.M., Mulrow, D., and Sobotka, L.G., "Evaluation of the Photophysical Properties of Two Scintillators: Crystalline Para-terphenyl and Plastic-Embedded 2,5-Diphenyloxazole Dye (EJ-276) at Room and Cryogenic Temperatures", J. Phys. Chem. A 2022, 126, 32, 5273-5282. [Niedzwiedzki, et. al., 2022].

Relman A.S. The physiological behavior of rubidium and cesium in relation to that of potassium. Yale J Biol Med. Dec. 1956;29(3):248-62. [Relman, A.S., 1956].

Yubo Liu, Baozhong Ma, Yingwei Lv, Chengyan Wang, Yongqiang Chen, Thorough extraction of lithium and rubidium from lepidolite via thermal activation and acid leaching, Minerals Engineering, vol. 178, 2022, 107407 [Liu, et. al., 2022].

Goates, J. Rex, and Ott, J. Bevan. 1969. "Solid-Liquid Phase Equilibria in the Sodium-Rubidium Alloy System". United States. [Goates, et. al., 1969].

Delawarde, Elisabeth M., "Solid-liquid phase equilibria of the potassium-rubidium and rubidium-cesium alloy systems", A Thesis Presented to the Department of Chemistry Brigham Young University, May 1971. [Delawarde, 1971].

Ott, J. B. et al. "Solid + liquid phase equilibria in the ternary alloy: sodium + potassium + rubidium." The Journal of Chemical Thermodynamics 5 (1973): 143-145. [Ott, et. al., 1973].

(56) References Cited

OTHER PUBLICATIONS

Goates, J. Rex, J. Bevan Ott and Chen C. Hsu. "Solid-liquid phase equilibria in the sodium-rubidium alloy system." Transactions of The Faraday Society 66 (1970): 25-29. [Goates, et. al., 1970].
Ham, Norman S., and A. Walsh. "Potassium and rubidium Raman lamps." The Journal of Chemical Physics 36.4 (1962): 1096-1097 [Ham, et. al., 1962].
Yun Yang, Xiaoyu Dong, Shilie Pan, and Hongping Wu, The Rubidium Barium Borate Resulting from B7O15 Fundamental Building Block Exhibits DUV Cutoff Edge, Inorg. Chem. 2018, 57, 21, 13380-13385. [Yang, et. al., 2018].
Steven P. Denbaars, Daniel Feezell, Katheryn Kelchner, Siddha Pimputkar, Chi-Chen Pan, Chia-Chen Yen, Shinichi Tanaka, Yuji Zhao, Nathan Pfaff, Robert Farrell, Mike Iza, Stacia Keller, Umesh Mishra, James S. Speck, Shuji Nakamura, "Development of gallium-nitride-based light-emitting diodes (LEDs) and laser diodes for energy-efficient lighting and displays", Acta Materialia 61 (2013) 945-951. [DenBaars, et. al., 2013].
Górecki K, Ptak P, Torzewicz T, Janicki M. Influence of a Thermal Pad on Selected Parameters of Power LEDs. Energies. 2020; 13(14):3732. [Górecki, et. al., 2020].
Eklund, E. J., Shkel, A.M., Knappe, S., Donley, E., and Kitching, J., "Spherical Rubidium Vapor Cells Fabricated by Micro Glass Blowing", MEMS 2007, Kobe, Japan, Jan. 21-25, 2007. [Eklund, et. al.].
Yingwei LV, Peng Xing, Baozhong Ma*, Yubo Liu, Chengyan Wang*, Wenjuan Zhang, and Yongqiang Chen, Efficient Extraction of Lithium and Rubidium from Polylithionite via Alkaline Leaching Combined with Solvent Extraction and Precipitation ACS Sustainable Chem. Eng. 2020, 8, 38, 14462-14470, Publication Date: Sep. 3, 2020 [Lv, et. al., 2020].

E. B. Alexandrov, M. V. Balabas, D. Budker, D. English, D. F. Kimball, C.-H. Li, and V. V. Yashchuk, Light-induced desorption of alkali-metal atoms from paraffin coating, Phys. Rev. A 66, 042903—Published Oct. 23, 2002; Erratum Phys. Rev. A 70, 049902 (2004). [Alexandrov, et.al., 2002].
C. Klempt, T. Van Zoest, T. Henninger, O. Topic, E. Rasel, W. Ertmer, and J. Arlt, Ultraviolet light-induced atom desorption for large rubidium and potassium magneto-optical traps, Physical Review A 73, 013410, 2006. [Klempt, et. al., 2006].
R. Daschner, H. Kübler, R. Löw, H. Bauer, N. Frühauf, and T. Pfau. Triple stack glass-to-glass anodic bonding for optogalvanic spectroscopy cells with electrical feedthroughs. Appl. Phys. Lett., 105:041107, 2014. [Daschner, et. al., 2014].
Renate Daschner, "Addressable Rubidium vapor cells for optical and electrical read-out of Rydberg excitations", Doktors der Naturwissenschaften Thesis, Physikalisches Institut der Universität Stuttgart, 2015. [Daschner, 2015].
Na Wu et al 2023 Nanotechnology 34 145701 [Na Wu, et al., 2023].
Seok Hee Lee, Yang Kim, and Karl Seff, "A Cationic Rubidium Continuum in Zeolite X", J. Phys. Chem. B 2000, 104, 47, 11162-11167. [Seok, et. al., 2000].
Jack Porter Stone, Curtis T. Ewing, R. L. Karp, J. R. Spann, and Roman Rodney Miller, "Predicted high-temperature properties of rubidium", J. Chem. Eng. Data 1967, 12, 3, 352-356. [Stone, et. al.; 1967].
Lina Yang, Bin Liu, Yuhua Wang, Takatoshi Seto, Novel Double Light-Color (Blue and Red) Phosphor Sr9Ca (Li, Na, K)(PO4)7:Eu2+ Excited By NUV Light for Outdoor Plant Cultivation. Advanced Materials Technologies.
Ihab I Sadek *, Fatma S Moursy and Tarek M Younis, Performance of lettuce plants under organic mulch and LEDs light colors, GSC Advanced Research and Reviews, 2021, 07(03), 126-141, Jan. 12, 2024.

* cited by examiner

| $^{85}$Rb | 5S$_{1/2}$ nm | 5P$_{1/2}$ nm | 5P$_{3/2}$ nm | 4D$_{5/2}$ nm | 4D$_{3/2}$ nm | 6S$_{1/2}$ nm |
|---|---|---|---|---|---|---|
| 5P$_{1/2}$ | 794.9789 | | | | | |
| 5P$_{3/2}$ | 780.2415 | | | | | |
| 4D$_{5/2}$ | | | 1529.3658 | | | |
| 4D$_{3/2}$ | | 1475.6447 | 1529.2615 | | | |
| 6S$_{1/2}$ | | 1323.8791 | 1366.8737 | | | |
| 6P$_{1/2}$ | 421.67261 | | | | 2293.877 | 2791.292 |
| 6P$_{3/2}$ | 420.29891 | | | 2253.578 | 2253.805 | 2732.180 |
| 5D$_{3/2}$ | | 726.1030 | 776.1570 | | | |
| 5D$_{5/2}$ | | | 775.9786 | | | |
| 7S$_{1/2}$ | | 728.2002 | 741.0211 | | | |
| 4F$_{7/2}$ | | | | 1344.6483 | | |
| 4F$_{5/2}$ | | | | 1344.6436 | 1344.7242 | |
| $^{87}$Rb | 5S$_{1/2}$ nm | 5P$_{1/2}$ nm | 5P$_{3/2}$ nm | | | |
| 5P$_{1/2}$ | 794.9789 | | | | | |
| 5P$_{3/2}$ | 780.2415 | | | | | |
| 6P$_{1/2}$ | 421.67261 | | | | | |
| 6P$_{3/2}$ | 420.29891 | | | | | |
| 5D$_{3/2}$ | | 762.1030 | 776.1570 | | | |
| 5D$_{5/2}$ | | | 775.9786 | | | |
| 7S$_{1/2}$ | | 728.2002 | 741.0211 | | | |
| 7P$_{1/2}$ | 359.25967 | | | | | |
| 7P$_{3/2}$ | 358.80734 | | | | | |

| $6P_{1/2}$ nm | $6P_{3/2}$ nm | $5D_{3/2}$ nm | $5D_{5/2}$ nm |
|---|---|---|---|
| | | | |
| | | | |
| | | | |
| | | | |
| | | | |
| | | | |
| | | | |
| 5036.63 | 5241.24 | | |
| | 5233.12 | | |
| 3851.552 | 3970.072 | | |
| | | | 9186.16 |
| | | 9161.02 | 9185.94 |
| $6P_{1/2}$ nm | $6P_{3/2}$ nm | $5D_{3/2}$ nm | $5D_{5/2}$ nm |
| | | | |
| | | | |
| | | | |
| | | | |
| 5036.629 | 5241.241 | | |
| | 5233.117 | | |
| 3851.552 | 3970.072 | | |
| | | 4684.973 | |
| | | 4609.200 | 4615.501 |

FIG. 1(Continued...)

Level scheme of rubidium of the 5S → 5P transition.

WHITE LIGHT LED WITH RUBIDIUM VAPOR EMISSION IN NESTED ENCLOSURE OPTIMIZING HUMAN VISION AND HORTICULTURAL PIGMENT IRRADIANCE

This non-provisional application claims benefit of provisional application Ser. No. 63/491,793, filed on 23 Mar. 2023, which is incorporated herein by reference in its entirety.

BACKGROUND

Note: All the references provided in this application are widely available to all, in their full format: none are private communications; all are publicly disclosed manuscripts.

Solar irradiance plays an important role in photosynthesis and human vision. However, the chromophore that initiates both processes are widely different yet absorb the radiation that is available from the same source, the sun, in an effective manner. However, the sun does not always shine, and is of course not available in the complete indoors. Hence the genetic evolution of these disparate approaches to converting solar energy into chemical energy often must be enhanced with artificial irradiance, starting with fire millennia ago and now with nanosized p-n junctions of light-emitting diodes, so-called solid-state lighting, to allow for indoor farming and other human-based indoor activities. All too often, efficient artificial lighting has relied on a stimulating light, to be subsequently modified, that is considered by a human observer to be violet or blue. The reason is of course due to quantum mechanics and thermodynamics. It is easier to convert high energy light, such as blue light, into desired wavelengths of lower energy light than it is to do the opposite. [More formally, the Boltzman distribution of states indicates a greater probability for lower potential energy states (and a greater probability for higher entropy states).]. Older technology such as incandescence generates thermal radiation whose spectrum looks like a blackbody radiator, like the sun, but which is terribly inefficient. Hence the excessive violet and or blue light origins of more efficient light have negative impact on human vision and photosynthesis, whose peaks of quantum activity are elsewhere in the solar spectrum of radiation. [Of course, it is the propensity of states to reach lower energy over time is what allows for nature to achieve a never-ending cycle in photosynthesis and human vision, stimulated by the absorption of never-ending radiation from the sun to populate those higher energy states which will subsequently be depopulated to achieve states of maximum entropy.]

Lighting for agriculture has been revolutionized with the appearance of solid-state lighting, as has been lighting for residential and industrial spaces. The instant invention improves the performance of such lighting to align with the specific and different requirements for each of these markets: agricultural, industrial, and residential.

The concept of using solid-state lighting for agriculture emanated from early consideration by scientists from the National Aeronautics and Space Administration (NASA) and their funded academic center at the University of Wisconsin-Wisconsin Center for Space Automation and Robotics (WCSAR) and the Department of Horticulture, University of Wisconsin-Madison—on how to propagate crops in space. Two names are often cited as pioneer thinkers for agricultural application of light-emitting diodes: Tibbitts and Bula.

Light Emitting Diodes and Horticulture.

The manuscripts with Tibbitts and Bula as authors in peer reviewed journals detail many unique aspects of the scientific discoveries relevant to horticulture under lighting not provided by the sun. In retrospect and perhaps unintended, their writings in the period of 1990 through 1994 provide an independent assessment on the brightness (or lack of brightness) of blue light-emitting diodes then emerging, based on GaN or SiC. At that time these blue light-emitting diode were not bright enough for most industrial applications, but for which there was little independent assessment as to what was actually qualified to be claimed as a high-brightness blue light-emitting diode.

By way of example, a citation of relevance is "Evaluation of light emitting diode characteristics for a space-based plant irradiation source." [Barta, et. al., 1992-A] At the time of this pioneering work around published in 1992, from the University of Wisconsin, white light light-emitting diodes using down-conversion (diode dies with phosphors) had not yet been invented. Further, blue light-emitting diode components were in their infancy in 1992 and despite self-acclamation, then, by their inventors as high brightness blue, the reality was that these nascent devices were not so bright and not useful for any contemporaneously invented applications requiring bright illuminance, such as horticulture. [See Barta, et. al.].

The invention of white light-emitting diodes using down-conversion-based on phosphors scattering blue light from blue light-emitting diodes and related mechanisms—was an invention with high commercial importance due to the market size of general illumination. In contrast, the perceived commercial importance of blue lighting was thought to be rather insignificant; the end product often envisioned during development of blue LEDs was for indicator lights, which need not be very bright. The invented solution and requirements of high brightness white light light-emitting diodes for general illumination is what led to the ever-increasing demand for improvement in the performance of blue light-emitting diodes over an initial decade from 1996 to 2006. Over the subsequent decade after 2006, the performance of white light light-emitting diodes increased to the point they replaced incandescence and fluorescence in general illumination. However, the scientific enhancement of blue light-emitting diode die efficiency over that twenty-year period was not the driving force as expected and, by some, retrospectively suggested as fact. Rather, the ultimate advancements in white light-emitting diode solid-state lighting came from the realization that lower cost and not highly efficient blue LED dies could be commingled and easily accomplish the same goal without the white light LED requiring the benefit of truly high-brightness LEDs. This is to say that the hoped-for efficiencies and lighting flux for blue dies never materialized to such an extent that one die could replace one filament. It is often the case that the primary innovation—white light LEDs—fostering impressive scientific development—blue LED dies—of components is, in fact, the substantive invention that provides for how a component is to be used in a commercially viable and expansive application. [The instant inventor advances this argument even though there is evidence that blue light LED efficiency increased ten-fold over the same decade after the invention of white light LEDs through down-conversion was first claimed. Considering how dim the high brightness blue LED single dies were, with perhaps 3 to 4% efficiency, even a ten-fold improvement in the subsequent periods do not account for the tremendous growth in white light LED replacements of incandescence and fluorescence lighting.]

For example, in the current decade, it is the innovation and invention of novel electric powered automobiles that is driving the scientific research in electrochemical cells and rapid remote charging of said cells. Retrospectively, after the scientific innovation of the component is achieved and used in a commercial application that foresaw the fundamental societal benefit-high brightness white solid-state lighting—it is common that the driver is incorrectly attributed to the scientific innovations of the component. Succinctly, it is white light LEDs that drove the innovation of blue LEDs, and not that it was obvious to benefit from the innovation of blue LEDs to drive the invention of white LEDs. However, continued innovation in white LEDs is required as the applications to which this technology is applied is ever increasing with new requirements and subtleties.

In this historical regard, Barta, et. al. made two observations of high importance to understanding requirements for horticulture: 1) with respect to specific GaAlAs red LEDs then available (1992), "they emit radiation with a peak wavelength near the absolute spectral peak of maximum 'quantum action for photosynthesis'"; 2) increasing current through the red LED increased output but also increased temperature with a consequential decrease in electrical conversion efficiency. [Barta, et. al., 1992-A] Aluminum gallium arsenide (AlGaAs) red (Light-Emitting Diodes) LEDs were the first LEDs to exceed the luminous efficiency level of filtered incandescent light bulbs. This enabled LEDs to begin replacing light bulbs in many red exterior lighting applications such as in center high mount stop lights on motor vehicles. [Steranka, 1997.] [Holonyak. et. al., 1962.]

The development of LEDs for illumination and photosynthesis presumed that the higher efficiencies of LEDs-often stated to be 90% more efficient than the incandescence of thermal radiation generation-would eliminate the necessity for the transport of heat away from thermally vulnerable components in the solid-state device. Even at this early stage of development, Barta et. al. recognized that at high luminous flux, achievable only by inputting high current flux, even highly efficient LEDs begin to require cooling and effective heat dissipation through heat transport. [Barta, et. al., 1992-A] The instant invention uses a novel phase transition method to dissipate thermal energy into the heat of vaporization.

Even today, control of heat captured within clean rooms and greenhouses, all emanating from artificial lighting used in horticulture, is a formidable challenge. These innovators using solid-state light-emitting diodes were prescient in consideration of thermal transfer and the perhaps deleterious effects unwanted heat, manifested by increasing temperature, would have on crops grown indoors.

Barta et. al. noted that (at that time) then available GaAlAs LEDs have a narrow spectral output with a peak wavelength near 660 nm. [Barta, et. al., 1992-A] McCree also noted the maximum photosynthetic quantum action of plants, [McCree, 1971] and a maximum absorption region of chlorophyll aligned with these red light-emitting diodes. [Vernon, et. al., 1966.]. The half-power bandwidth was about 20 nm.

The spectral maximum of chlorophyll in the red (660 nm) is 1.4 times greater than a local maximum in the blue. In contrast, white light from incandescent, gas discharge or fluorescent lamps generated broad spectrum light, in the "photosynthetic quantum of action", even if made of a multitude of atomic line emissions. Hence, the early work in the beginning of the 1990's attempted to define what spectra lines were beneficial and which were not when considering propagation of the hundreds of crops that could be grown under artificial lighting, such wavelength selectivity uniquely available with careful selection of available light emitting diodes. At that time, it was not really known whether broad band excitation from white lights would be as beneficial to crops grown indoors as a comparison to those grown outdoors based on the broad spectral irradiance from the sun. Of interest, it is noted that the second Emerson effect is the enhancement of the yield of photosynthesis caused by far red light, by simultaneous illumination with light of shorter wavelengths. [Lysenko, et. al., 2014.]. It is only until recently that temporal changes in artificial lighting are studied as potentially beneficial to the propagation of crops, mimicking to some degree the daily and monthly variations in light during daylight under various and ever-changing weather conditions.

Barta et. al. also remarked in 1992, for the historical record, that "highly efficient LEDs with peak wavelengths shorter than 630 nm are not currently available. Gallium phosphide (GaP) and gallium arsenide phosphide (GaAsP) LEDs are available with peak wavelengths between 550 and 640 nm but have considerably less output compared with GaAlAs LEDs. Silicon carbide (SiC) LEDs are available with output between 400-500 nm, but achievable intensities are only about one one-thousandth of that available from GaAlAs LEDs. High output LEDs having a peak wavelength in the blue region of the spectrum would greatly enhance the development of LED-based plant irradiation systems, because some higher plants have a photomorphogenic requirement for blue light". [Barta, et. al., 1992-A] Retrospectively, in an application such as this, one one-thousandth of intensity versus other sources is not high brightness.

The poor situation regarding blue light LEDs was cited by Barta et. al. with the comment "When red photon emitting LEDs are used as an irradiance source for some plant species, a quantity of blue photons is required (5 to 10% of the total photons). The electrical conversion efficiency of commercially available blue photon emitting SiC LEDs, however, is too low at this time to be useful in LED-based plant irradiation systems. Efficient LEDs that emit in the blue region of the spectrum may become available in the future. To provide blue irradiance when required by specific crops, we have supplemented LED irradiation systems with blue-phosphor fluorescent lamps." [Barta, et. al., 1992-A]

With respect to white light, Barta et. al. reference a white light fluorescent tube lamp, required in 1992 as the white light LED was not yet invented. [Barta, et. al., 1992-A] Further, for the record, the output of blue light SiC in 1992 is referenced as being one one-thousandth of that which was necessary. It is believed that Barta et. al. used germicidal fluorescent lamps, which peaked at 365 nm, but with 410 nm emissions as well, in the absence of blue SiC based LEDs. [Barta, et. al., 1992-A]

Hoenecke, Bula and Tibbitts published "Importance of 'blue' photon levels for lettuce seedlings grown under red-light-emitting diodes" detailing the requirement of blue and red light for horticulture wherein they used red light-emitting diodes, readily available since the 1970's, and blue emission from fluorescent lights. [Hoenecke, et. al., 1992.]. This reference teachings in more detail what wavelengths of light are beneficial, and which are not, in what, at that time, was nascent research on solid-state lighting for horticulture and indoor agricultural crops.

Another reference considered by many as pioneering is an early paper on light-emitting diodes as a radiation source for plants. [Bula, et. al. 1991]. For historical precedence, we quote from Janda, et. al.: "The use of LEDs for plant growth was first suggested by Bula et al. (1991). They studied lettuce plants under red LEDs supplemented by blue fluorescence lamps. At the time red LEDs were the most efficient and they emit light that corresponds to the absorbance peak of chlorophyll (660 nm). However it was known that blue light is also important for plant development and morphology, yet blue LEDs were then unavailable." [Janda, et. al., 2015.]

We continue to quote from Janda, et. al.: "In previous work, Cope and Bugbee (2013) have also used continuous-spectrum LED-diodes and have shown that for some plant species the relative ratio of blue to red light is important while for some others the absolute amount of blue light is a better descriptor [Cope et. Al., 2013]. It has also been shown many times that green light opposes the effects of the red and blue wavebands (for an excellent review see [Folta, et. al., 2007)."

Folta et. al. stated more recently "Data reproduced from Went's green-depletion experiments" in 1957. Tomato seedlings were grown under white light or lavender filters (lower green) and the dry mass of seedlings was measured after 6 d. The data show that, at low fluence rates, red and blue light are more efficient than white light (red, blue, green) in influencing vegetative growth, as expected. However, at higher fluence rates the white light-grown plants achieve a lower biomass than those grown in green depleted conditions, even when light intensity is high." The author interpreted these findings as evidence of inhibition of growth by green light. [from Folta, et. al., 2007]

Thus, it is clear that for artificial lighting sometimes irradiance in the blue and in the red are most helpful and sometimes irradiance in the green is unhelpful. The exact reason has not been presently teased out as obviously there are green light receptors in all plants.

Considering the time of these early 1990-1992 studies were conducted, Kevin R. Copel and Bruce Bugbee (Department of Plants Soils and Climate, Utah State University, 4820 Old Main Hill, Logan, UT 84322-4820), in another independent assessment, retrospectively state that "blue LEDs were only 3% to 4% efficient, whereas red LEDs were 15% to 18% efficient (Massa et al., 2006). As such, the goal of these studies was to determine the minimum amount of blue light necessary for normal growth and development (Kim et al., 2005). The efficiency of blue LEDs has since dramatically increased to more than 30%. Because white LEDs are produced by using blue LEDs and phosphors, an increase in the efficiency of blue LEDs has made efficient white LEDs possible. (Pimputkar et al., 2009). Copel et. al. relies on Kim et. Al. as well as Pimpukar et. al. [See Kim, H. H., R. Wheeler, J. C. Sager, N. Yorio, and G. Goins. 2005. Light-emitting diodes as an illumination source for plants: A review of research at Kennedy Space Center. Habitation (Elmsford) 10:71-78. Also, see Pimputkar, S., J. S. Speck, S. P. DenBaars, and S. Nakamura. 2009. Prospects for LED lighting. Nat. Photonics 3:180-182.]. This reference is one of the few that comments on the retrospective performance of what was called high-brightness blue LEDs. [It is more accurate to say that the need for higher brightness white light LEDs necessitated the development of increased efficiency of blue LEDs, not the other way around.]

Copel et. al. report the photobiological effects of three types of white LEDs (warm, neutral, and cool, with 11%, 19%, and 28% blue light, respectively) on the growth and development of radish, soybean, and wheat. Overall, the low blue light from warm white LEDs increased stem elongation and leaf expansion, whereas the high blue light from cool white LEDs resulted in more compact plants. For radish and soybean, absolute blue light was a better predictor of stem elongation than relative blue light, but relative blue light better predicted leaf area. The optimal amount of blue light likely changes with plant age because plant communities balance the need for rapid leaf expansion, which is necessary to maximize radiation capture, with prevention of excessive stem elongation. [Quotation marks omitted for clarity but the above essentially is quoted in full.].

As Copel et. al. concludes: "A thorough understanding of this interaction is essential to the development of light sources for optimal plant growth and development." They also predict: "Manipulating plant growth and development. It is clear that light quantity and quality interact to determine plant morphology. The optimal light spectrum for plant growth and development likely changes with plant age as plant communities balance rapid leaf expansion necessary to maximize radiation capture with prevention of excessive stem elongation. A thorough understanding of this balance is essential to the development of LED light sources for plant growth and development. Overall, the low blue light from warm white LEDs increased stem elongation and leaf expansion, whereas the high blue light from cool white LEDs resulted in more compact plants. Initial growth under cool white LEDs should promote the growth of short, sturdy hypocotyls. Subsequent transition to warm white LEDs should promote leaf expansion. Finally, after canopy closure, cool white LEDs should be used again to prevent excessive stem elongation. These effects could also be obtained by modulating the electrical current to red and blue monochromatic LEDs, thereby achieving different blue ratios without the requirement for two sets of LEDs. Cool white LEDs may be the light source of choice because their high percentage of blue light (25%) means that they can meet the blue light requirements for normal development, even at low PPFs. Furthermore, our measurements indicate that cool white LEDs are more electrically efficient than the neutral and warm white LEDs (data not shown)." Despite the early conclusions of Copel et. al., the usage of high brightness cool white light LEDs, with all of the heat that they generate at the site of the Stokes shift, a heat-generating Stokes shift, turns out not to be the optimal spectral distribution for many plants grown under artificial lighting. Using only (but alternative) phosphors does not eliminate these deficiencies and disadvantages. The instant invention remedies the current deficiencies and disadvantages.

Recent work indicates that plants have a way to accommodate natural changes in sunlight intensity: when light conditions change significantly, plants produce the orange pigment zeaxanthin, which is also involved in sun protection. The production of this sunscreen is suppressed by the protein KEA3 under high light conditions as well. [von Bismarck et. al., 2022]. KEA3 is a thylakoid membrane localized K+/H+ antiporter that regulates photosynthesis by modulating two components of proton motive force (pmf), the proton gradient ($\Delta pH$) and the electric potential ($\Delta \psi$).

Light Emitting Diodes and Human Vision.

For industrial and residential use, the type of lighting that is preferred does not parallel that which works for indoor farming. Nor is it expected that is should. After all, chlorophyll is vital for plants but is unused in the vision of humans and animals. The pigment chlorophyll contains a heterocyclic chromophore called chlorins which are tetrapyrrole pigments that are partially hydrogenated porphyrins. For chlorophyll, the heterocycle is coordinated with magnesium. Mammalian vision is a complex interplay of many different proteins, enzymes, cells and photoactive small molecules. The principal players are the small molecule 11-cis-retinal and the protein rhodopsin. Retinal comes from the condensation of isoprenyl groups. Subsequent to the conversion of 11-cis-retinal to all-trans form, a protein called RPE65 intervenes and converts an all-trans analog back to the 11-cis form for subsequent conversion to the 11-cis-retinal active. RPE65 is known as Retinal pigment epithelium-specific 65 kDa protein. [von Lintig, et. al., 2010.]

The complexity of human vision is perhaps revealed when one considers that vision disease is caused by many possible factors. For example, absent the conversion of the trans-retinyl isomer back to the 11-cis one, the vision cycle cannot continue. It has been stated that "o(O)ver 60 different mutations in the RPE65 gene have been associated with a heterogeneous group of inherited retinal dystrophies including Leber's congenital amaurosis (LCA) and autosomal recessive retinitis pigmentosa (RP). These diseases are usually associated with blindness from birth or early childhood. Mutations in the RPE65 gene account for approximately 2% of cases of recessive RP and approximately 16% of cases of LCA in human." [Cai, et. al., 2009.]

"Regeneration of visual chromophore following light exposure is dependent on an enzyme pathway called the retinoid or visual cycle. Defects in nearly every step of this pathway are responsible for human-inherited retinal dystrophies. These retinal dystrophies can be divided into two etiologic groups. One involves the impaired synthesis of visual chromophore. The second involves accumulation of cytotoxic products derived from all-trans-retinaldehyde." [Cai et. al., 2009.] The isomerase in RPE cells catalyzes the energetically unfavorable conversion of a planar all-trans-retinoid to the sterically constrained 11-cis configuration. The isomerase uses all-trans-retinyl esters as substrate. [Cai et. al., 2009.]

"Accumulation of fluorescent lipofuscin pigments in cells of the RPE is an important pathological feature of Stargardt disease. These pigments are responsible for the "dark choroid" seen during fluorescein angiography and the fundus autofluorescence seen by scanning laser ophthalmoscopy. The maximum emission wavelength of lipofuscin fluorescence in Stargardt patients is 650 nm, which corresponds to the emission maximum of A2PE-H2, an abundant A2E precursor in abcr–/– mice. [See Kim S R, Fishkin N, Kong J, Nakanishi K, Allikmets R, Sparrow J R. Rpe65 Leu450Met variant is associated with reduced levels of the retinal pigment epithelium lipofuscin fluorophores A2E and iso-A2E. Proc Natl Acad Sci USA. 2004 Aug. 10; 101(32): 11668-72 wherein is described exploration of A2E levels in mice bearing methionine vs. leucine at residue 450 of Rpe65.]. The cytotoxicity of A2E in RPE cells is well established. A2E has been shown to sensitize RPE cells to blue-light damage, impair the degradation of phospholipids from phagocytosed OS, induce the release of pro-apoptotic proteins from the mitochondria, and destabilize cellular membranes through its properties as a cationic detergent. Further, irradiation of A2E with violet/blue (430 nm) light resulted in a series of oxirane products containing up to nine epoxide rings, formed by the addition of singlet oxygen to double bonds along the polyene chains. A2E oxiranes were shown to induce DNA fragmentation by forming adducts with purines and pyrimidines in cultured ARPE-19 cells, representing still another mechanism of A2E cytotoxicity. As expected, lipofuscin accumulation, indicated by fundus autofluorescence, precedes macular degeneration and visual loss in Stargardt patients. Hence, the likely sequence for photoreceptor degeneration in Stargardt disease is (a) lipofuscin accumulates in cells of the RPE; (b) RPE cells begin to function abnormally and ultimately degenerate owing to A2E-mediated cytotoxicity; and (c) the photoreceptors die secondary to loss of the RPE support-role, resulting in blindness. In Stargardt disease, the greatest concentration of lipofuscin is seen in RPE cells overlying the perifoveal region of the macula. The macula is located at the optical center of the retina and contains the highest density of photoreceptors. The vulnerability of the macula in Stargardt and other macular degenerations is due to the increased ratio of photoreceptors to RPE cells and high incident light in this region." The carbons in an epoxide group are very reactive electrophiles, due in large part to the fact that substantial ring strain is relieved when the ring opens upon nucleophilic attack. Clearly reduction of violet or blue light exposure is of importance to those with Stargardt disease.

The Spectral Maximum of Energy and Entropy in Radiation-Induced Biological Processes.

Certainly, for human vision, one would expect that the optimal or perhaps maximal wavelength is that energy maximum which can be obtained from a blackbody operating at the temperature of the Sun. However, alternative theories remain. We quote by way of example Delgado-Banal, et. al.: "It is commonly accepted that the evolution of the human eye has been driven by the maximum intensity of the radiation emitted by the Sun. However, the interpretation of the surrounding environment is constrained not only by the amount of energy received but also by the information content of the radiation. Information is related to entropy rather than energy. The human brain follows Bayesian statistical inference for the interpretation of visual space. The maximization of information occurs in the process of maximizing the entropy. Here, we show that the photopic and scotopic vision absorption peaks in humans are determined not only by the intensity but also by the entropy of radiation. We suggest that through the course of evolution, the human eye has not adapted only to the maximum intensity or to the maximum information but to the optimal wavelength for obtaining information. On Earth, the optimal wavelengths for photopic and scotopic vision are 555 nm and 508 nm, respectively, as inferred experimentally. These optimal wavelengths are determined by the temperature of the star (in this case, the Sun) and by the atmospheric composition." [Delgado-Bonal, A., Martín-Torres, J. Human vision is determined based on information theory. Sci Rep 6, 36038 (2016).]

Delgado-Bonal, et. al., further state: "The currently effective temperature of our sun (5800 K) is almost the same as in the Cambrian Explosion, when it is believed that the first eyes appeared and continued to evolve. The radiation from the Sun passes through the atmosphere, interacting with molecules in processes such as scattering and absorption. We find that the maximum of the radiation is located at 547 nm, and the maximum of the entropy is reached at 564 nm. The optimal wavelength, defined before as the wavelength where the product of the two distributions is maximized, occurs at 555 nm, exactly matching the photopic absorption peak. In situations in which radiation passes through the atmosphere without scattering, such as in late afternoon when the environment shifts to low light, the maximum of the product is located at 508 nm, almost identical to the scotopic vision absorption peak (507 nm). These results suggest that for the optimal design of an instrument to detect and interpret the environment, the optimal wavelength will be the given by the proposed equation $\lambda T = b_{optimal}$. This suggests that the evolution of the human eye is optimized to look not for the maximum intensity of radiation or for the maximum information but for the optimal wavelength at which to obtain information about the environment." The absorption wavelength maximum for 11-cis retinal, the vision cycle chromophore, when bound to the protein rhodopsin, is at 500 nm. For chlorophyll, the maximum is further in the red. Chlorophyll a absorbs violet (max. 372 nm) and orange light (max. 642 nm) the most; the mid-point being 507 nm. Chlorophyll b absorbs mostly blue (max. 392 nm) and yellow (max. 626 nm) light; the mid-point being 509 nm. They both also absorb light of other wavelengths with less intensity. Intriguing in that both mid-points are nearly identical to the mid-point between energy and entropy maximum of scattered sunlight. Unlike Delgado-Banal's hypothesis for human vision, though, these two (chlorophyll) mid-points are in the region where the sunlight is not absorbed but is reflected by chlorophyll. That is, neither of them absorbs green, so the leaf looks green because that light is reflected to our eyes instead of being absorbed by the leaf. The violet and blue absorption is always less than the orange and yellow light, respectively. The significance of the reflected light at the mid-point between two energy maxima is not clear with respect to driving the photosynthetic process. The entropy of radiation biology was discussed by E. Broda and H. Pietschmann (BioSystems, Vol. 11, pp 65-76, 1979) whereby they differentiate radiation used for energy, in photosynthesis, versus radiation used for signaling, such as in phototaxis (differentiation of plants by the phytochrome system), and animal vision. In contrast, the instant invention teaches that the entropy of radiation influences the work performed and required to initiate and complete animal vision.

Artificial Lighting Requirements and Versatile Needs.

Artificial lighting is more than 100 years old, and it turns out that present day there are certain sociological preferences for the spectrum of light, in particular when used for indoor habitation and as a replacement for outdoor lighting from the sun.

White light light-emitting diodes (white light LEDs) generate reasonably efficiently achromatic illuminance and luminance, although it is usually desirable to introduce some chromaticity to what is normally considered to be white light. As the historical record indicates, it is also preferential that the amount of blue light in what is otherwise characterized as achromatic radiation should be reduced, both to create a positive radiation field for photosynthesis and a less deleterious field exacerbating disease of the human eye. More red emission should be added to the achromatic lamps of today; reduce the blue radiation is of paramount importance in artificial lighting. Color can be conveyed as chromaticity coordinates.

The chromaticity coordinates are often expressed on a 2-dimensional chromaticity diagram like that which is defined by a compendia known as CIE1931. This diagram shows all the hues perceivable by the standard observer for various (x,y) pairs and also indicates the spectral wavelengths of the dominant single frequency colors. The white point on this diagram corresponds to a color temperature of 6,500K (representative of average daylight).

The black arc plotted in the interior of the CIE1931 chromaticity diagram gives the chromaticity coordinates of emission from a blackbody at temperatures between 1000 K and infinity. It is called the Planckian locus and is a convenient way of representing a white light source. Positions along the Planckian locus can be specified by the temperature of the blackbody, called the color temperature, thereby reducing the two numbers of chromaticity coordinate, to a single number. A non-blackbody source is often described by the correlated color temperature (CCT), which is the temperature of a blackbody radiator that most closely resembles the color from a source of equal brightness. Lines of a specified (constant) CCT would cross the Planckian locus at coordinates of that blackbody temperature. A powerful feature of the chromaticity diagram is that light produced by mixing output from two sources having different chromaticity coordinates will fall on the line connecting the coordinates of the sources alone; the position along the line is determined by the weighted average of the brightness of each source. Similarly, the chromaticity coordinate of light produced by mixing three light sources will fall within the triangle formed by the chromaticity coordinates of the three sources as the vertices. Color falling outside this triangle cannot be produced by mixing the three sources.

It is desirable for otherwise achromatic residential lighting in North America to introduce some red coloration to the white light emission: this is called warm white light which is normally preferred by North American consumers for lighting within their homes. Cold white light is devoid of red elements, has an excess of blue elements, and is preferred in office and industrial lighting, especially in warehouses and factories.

Cold white light is relatively easy to generate using Down-Conversion of blue light-emitting diodes with secondary fluorescent emitters. Generally, red elements have been introduced into white light LED's by adding a solid-state inorganic phosphor that spontaneously emits in the red visible region when stimulated by uv or blue light emitting diodes incident thereupon. However, phosphors degrade over time so that the desired red element slowly loses its contribution to the white light so produced whereupon the chromaticity tends from hot white light to cold white light over time.

This evolution from hot to cold white light in solid state lighting is unwanted and a solution to prevent is now necessary. The instant invention provides said solution in a novel manner with no precedence in the literature. Solid-state lighting devices which emit in the blue and the red are desirable for the growing of vegetation in indoor settings and for the propagation of warm indoor lighting and reduce the blue photons emitted. The use of Dual-Color (blue and red) light-emitting diodes give off, on a color wheel, a coloration that is pink like as opposed to simply warm white light.

BRIEF SUMMARY OF THE INVENTION

The instant invention uses alkali metal vapor, preferably rubidium metal vapor from either an alkali metal, or preferably an alkali metal alloy, even more preferably from rubidium metal or a rubidium: alkali alloys, coupled, within a microelectronic device, with light-emitting diodes, to provide the red element necessary to provide white light of any possible chromaticity coordinates initially and over time. The heat from the light-emitting diode, a heat-generating p-n junction, and the site of the Stokes shift, a heat-generating Stokes shift, is used to support the vaporization of the alkali metal atoms, or more preferably the rubidium atoms from an alloy thereby cooling the microelectronic device. Assisting in the vaporization is that certain elements of the microelectronic device are under a vacuum.

Atoms luminesce at the same wavelengths at which they absorb. If there is a Stokes shift in atom spectroscopy it is related to transitions from one electronic state to another, but this is not caused by intervening phonons.

The persistent lines of rubidium atom absorption and atomic emission are, for Rb I, 420.180 nm, 421.553 nm, 780.027 nm and 794.760 nm. The radiative lifetime for each transition is 5.5 nanoseconds, 27.0 nanoseconds and 29.4 nanoseconds, respectively. The emissions at 780 and 795 nanometers are the principal atomic line luminescence of interest to the instant invention. The absorption reduced transmission of the 420 and 421 nm lines are of benefit to the instant invention. The singly ionized atom of rubidium, known as Rb II, also has lines of emission that are of interest to the instant invention although the singly ionized form is not expected to have any appreciable concentration in the claimed devices although the photoelectric work function for rubidium metal is reported to be at 574 nm (49.6 kcal/mol). The Russell-Saunders nomenclature for the ground state of rubidium atoms is $^2S_{1/2}$. This nomenclature reveals that the ground state is a doublet. Heretofore, white light using blue LEDs and Down-Conversion have relied upon singlet states or triplet states to generate radiation bathochromic to the wavelength maximum of the blue light.

The rubidium optical transitions that are necessary for the instant invention originate from the ground electronic state and stimulated by violet or blue light. There is precedence for this electronic transition as described in "Absolute frequency measurement of rubidium 5S-6P transitions" by Glaser et. al. [see Glaser, C., Karlewski, F., Kluge, J., Grimmel, J., Kaiser, M., Günther, A., Hattermann, H., Krutzik, M. and Fortágh, J., 2020. Absolute frequency measurement of rubidium 5 S-6 P transitions. Physical Review A, 102(1), p. 012804.]. This absorption transition occurs at 420 nm and the exact positioning of the absorption and subsequent emissions may be modified due to Zeeman splitting by the presence of a magnetic field. Blue light generally is defined as visible light ranging from 380 to 500 nm. Blue light sometimes is further broken down into blue-violet light (roughly 380 to 450 nm) and blue-turquoise light (roughly 450 to 500 nm). Many of the commercial light LEDs that are colloquially called blue light most often have emission maxima near 450 nm.

Rubidium is the first alkali metal on the periodic table thought not to have been produced through nuclear fusion inside stars. As one of the heavier elements, the element is thought to have been produced by capture of neutrons—emanating from neutron star collapse—by lighter elements followed by the r-process, beta decay. The r-process allows a neutron to transform into a proton by changing the flavor of one of its constituent quarks from down to up and releasing an electron and an antineutrino at the same time. [Curtis, 2023.]

Naturally occurring rubidium element is composed of two isotopes; $^{85}$Rb (72.2%) and the radioactive $^{87}$Rb (27.8%), written as $^{85}$Rb and $^{87}$Rb as used herein. The radioactive isotope has a half-life that is rather long: ~$10^{10}$ years. Hence its safety to humans and mammals is of no concern. The stable isotope of rubidium, $^{85}$Rb, has 37 protons and 48 neutrons in its nucleus. The naturally occurring radioisotope, $^{87}$Rb, has 37 protons and 50 neutrons in its nucleus. There are 37 electrons in atomic rubidium: $^{85}$Rb has nuclear spin of 5/2 and $^{87}$Rb has nuclear spin of 3/2. [Millman, et. al., 1936]. The hyperfine splitting for $^{85}$Rb and $^{87}$Rb is 3036 MHz (0.28955 calories/mol) or 9.87 centimeters wavelength, and 6835 MHz (0.65186 calories/mol) or 4.39 centimeters wavelength, respectively. Note that centimeter radiation is a microwave frequency. As rubidium atom is similar to hydrogen atom, with a single valence electron in a s orbital to be commented on in more detail hereinafter, the above mentioned hyperfine splitting is due to transitions where nucleus spin-electron spin coupling creates hyperfine splits or small energy. For hydrogen atom, this hyperfine splitting and the transitions between them results in what is referred to as the 21 CM line. Both the electron and the proton have intrinsic magnetic dipole moments ascribed to their spin, whose interaction results in a slight increase in energy when the spins are parallel, and a decrease when antiparallel. In the case of hydrogen atom, the excitation between the two hyperfine split states occurs at 0.13546 calories/mol or 21.11 centimeters. This transition is highly forbidden from based on quantum mechanical selection rules with an extremely small transition rate of $2.9\times10^{-15}$ s$^{-1}$.

Whereas hydrogen atom has the electronic configuration of $1s^1$, rubidium has the electronic configuration of $1s^2$ $2s^2$ $2p^6$ $3s^2$ $3p^6$ $4s^2$ $3d^{10}$ $4p^6$ $5s^1$. The Noble gas krypton has the electronic configuration of $1s^2$ $2s^2$ $2p^6$ $3s^2$ $3p^6$ $4s^2$ $3d^{10}$ $4p^6$. Alternative notation for the electronic configuration of rubidium is [Kr] $5s^1$.

Each orbital in an atom is characterized by a set of values of the three quantum numbers n, l, and $m_l$, which respectively correspond to the electron's energy, angular momentum, and an angular momentum vector component (magnetic quantum number). Each such orbital can be occupied by a maximum of two electrons, each with its own projection of spin $m_s$.

The simple names s orbital, p orbital, d orbital, and f orbital refer to orbitals with angular momentum quantum number l=0, 1, 2, and 3 respectively. These names, together with the value of n, are used to describe the electron configurations of atoms. They are derived from the description by early spectroscopists of certain series of alkali metal spectroscopic lines as sharp, principal, diffuse, and fundamental. Orbitals for l>3 continue alphabetically (g, h, i, k, . . . ), omitting j because some languages do not distinguish between the letters "i" and "j".

Atoms with a single valence electron in their outermost shell, display doublet emissions for electronic spectroscopic transitions. For example, the so-called $D_1$ and $D_2$ lines for sodium atom is at 589.6 nm and 589.0 nm for an atomic (emission) transition from the $$3P_{3/2}$$

or $$3P_{1/2}$$

state to the 3S state, respectively. These doublet lines are characteristic of elements with a single valence electron. With respect to rubidium, because of the many accessible atomic orbitals for the valence electron in the $5s^1$ orbital, there are many electronic transitions known for the rubidium atom. Only a few transitions are required and used in the instant invention and some transitions are forbidden. As we have seen, a quantum forbidden transition is one that can occur but infrequently and or with lower radiative rates.

It is well known that rubidium atoms have four major absorptions of radiation and the subsequent emission at the same wavelength. With respect to the absorptions and emissions at 420.180 nm, 421.553 nm, 780.027 nm and 794.760 nm, the so-called persistent emission and absorption lines, the applicable state (absorption) transitions are:

1. 7,800.27 Ångstroms for the $$5^2S_{1/2}$$

state to $$5^2P_{\frac{3}{2}}$$

state (5s electron transition to 5p orbital); and
2. 7,947.60 Ångstroms for the $$5^2S_{1/2}$$

state to $$5^2P_{\frac{1}{2}}$$

state (5s electron transition to 5p orbital).
3. 4,215.53 Ångstroms for the $$5^2S_{1/2}$$

state to $$6^2P_{\frac{1}{2}}$$

state (5s electron transition to 6p orbital); radiative lifetime of 125 nanoseconds.
4. 4,201.80 Ångstroms for the $$5^2S_{1/2}$$

state to $$6^2P_{\frac{3}{2}}$$

state (5s electron transition to 6p orbital); radiative lifetime of 112 nanoseconds.

These electronic spectroscopic transitions (each one absorption and emission for an atomic luminescence process) are summarized as follows:

| Lower Energy State | Higher Energy State | s Orbital | p Orbital | Wavelength | Energy |
|---|---|---|---|---|---|
| $5^2S_{1/2}$ | $6^2P_{\frac{3}{2}}$ | n = 5 | n = 6 | 4,201.80 Ångstroms | 68.0460 kcal/mole |
| $5^2S_{1/2}$ | $6^2P_{\frac{1}{2}}$ | n = 5 | n = 6 | 4,215.53 Ångstroms | 67.8240 kcal/mole |
| $5^2S_{1/2}$ | $5^2P_{\frac{1}{2}}$ | n = 5 | n = 5 | 7,947.60 Ångstroms | 35.9750 kcal/mole |
| $5^2S_{1/2}$ | $5^2P_{\frac{3}{2}}$ | n = 5 | n = 5 | 7,800.27 Ångstroms | 36.6540 kcal/mole |

± comparison purposes, of organic luminescent materials. Absorption and emission in the 35 kcal per mole range is difficult for organic luminescent materials as such electronic spectroscopic states require conjugation of pi (π):pi (π) bonds, themselves easy to dissipate the energy (without luminescence) through isomerization (and other reactions) after excitation from the ground electronic state. In the instant invention, atomic luminescence is providing the required emission at the 35±5 kcal per mole range.

The higher energy rubidium electronic spectroscopic transitions are to higher principal quantum numbers and, of course, to higher energies of emission or requiring higher energy incident radiation to so effect.

To understand the energy levels of rubidium, consider the interaction between the electron and the nucleus and between both and an external magnetic field. The angular momentum of the valence electron is given by $$J=L+S$$

where L is the orbital angular momentum and S is the spin angular momentum. To get the total angular momentum of the atom, we must also include the nuclear component which is denoted as I. The atom angular momentum is then given by $$F=J+I$$

There are four principle mechanisms that determine the rubidium energy levels. They are, in order of decreasing strength, the coulomb interaction, the spin-orbit interaction, the hyperfine interaction, and the Zeeman splitting. These are shown in FIGS. 2a and 2b.

The rubidium 5S→5P→5D transitions are driven using radiation with λ=780 and 776 nm respectively. From the 5D state, atoms fluoresce down to the 6P state. The final transition to rubidium Rydberg levels is from the 6P state with radiation near λ=1016 nm. [Fahey, et. al., 2011]. The instant invention does not depend on the population of Rydberg states of rubidium atoms. When the population of 5P electronic excited states is large, said states are more likely to interact with another rubidium atom in its excited state than with an incident photon of the appropriate excitation wavelength; singlet-singlet annihilation rather than two-photon absorption, singlet-singlet annihilation rather than stimulated emission.

Since in rubidium the 5s orbital is partially occupied, the electronic transitions to and from the ground electronic state (without regard to Zeeman splitting) to excited states are derived from transitions to the following orbitals: 4d, 5p, 6s, 4f, 5d, 6p, 7s, 5f, 6d, 7p.

An electronic spectroscopic transition at 420 nm, then, reflects an electron excitation from the 5s shell to a 6p shell. Violet LEDs have wavelengths that overlap with the 420 nm transition and are thus able to transfer the energy from radiation emitted by the LEDs, when powered, said radiation appearing to a human observer to be of violet color, to the valence electron within the 5s shell of the rubidium ground state atom so that the electron is excited to a 6p shell. This trivial energy transfer, as it is commonly called, is the before said term electronic spectroscopic transition, regardless of the wavelength of excitation, and the valence shell from and the electron shell to that is occupied, before and after the transition, respectively.

The transition at 421.5 nm, then, reflects an electron excitation from the 5s shell to a 6p shell as well. Collectively, we call the 420 nm and the 421.5 nm transitions as the second resonance doublet. Violet LEDs have emission wavelengths that overlap with a 420 nm and 421.5 nm transition.

The transition at 780 nm, then, reflects an electron excitation from the 5s shell to a 5p shell and a corresponding atomic luminescence emission.

The transition at 794.7 nm, then, reflects an electronic transition from the 5s shell to a 5p shell. Collectively, we call the 780 nm and the 794.7 nm transition as the first resonance doublet.

The electronic excited state transitions for rubidium including Rb I are summarized elsewhere. [Sansonetti, 2006] Due to the large number of atomic states for the rubidium atom, there are many more emissions and absorptions in the visible domain beyond that elucidated here and contribute to the chromaticity coordinates of the claimed microelectronic device. However, these contributions not otherwise cited are small relative to the persistent emissions already expressed.

Ban et. al. have demonstrated that light that is characterized as violet (420 nm) populates the first resonance doublet but also reveals the orange emission from a dimeric $Rb_2$ $2^3\Pi g$ state which emits at 601 nm. The 420 nm excitation source was a Toptica DL100 with NLHV3000E laser diode. [see T. Bana, D. Aumiler, R. Beuc, and G. Pichler; "$Rb_2$ diffuse band emission excited by diode lasers"; Eur. Phys. J. D 30, 57-64 (2004)]. For atomic emissions, their spectral lines are generally the same as their absorption lines. Hence a 420 nm excitation of Rubidium atom provides for a violet emission at 420 nm as well as an orange emission and a red atomic emission. The orange emission is not "atomic" per se—single element—but is an atomic dimer which emits at 601 nm. Thus, there is no 601 nm atomic absorption line. Such a dimer emission requires a laser intensity as opposed to the normal intensity of light-emitting diodes and does not make a major contribution to the overall emission of the instant invention when compared against that of the persistent lines of emission. The violet colored emissions of rubidium atoms are well revealed in gas discharge lamps filled with rubidium vapor. [Jackson, 1933]

Another source that details the excited state emissions of rubidium atoms is presented within the Master Thesis of Julien Kluge. [Kluge, 2019]

Recall that the ground state atomic configuration of the Rubidium atom is $1s^2\ 2s^2\ 2p^6\ 3s^2\ 3p^6\ 4s^2\ 3d^{10}\ 4p^6\ 5s^1$. For the purpose of the instant invention, we are interested in transitions from one S electronic state to a P electronic state of the same principal quantum number: from the 5S to the 5P. We are also interested in the electronic transition from one S electronic state to one P electronic state of a different principal quantum number: from the 5S to the 6P orbitals. For 85Rb, the quantum mechanical allowed transitions (abbreviated set; see FIG. 1 for a more detailed set) are:

| $^{85}$Rb | $5S_{1/2}$ nm | $5P_{1/2}$ nm | $5P_{3/2}$ nm | $4D_{5/2}$ nm | $4D_{3/2}$ nm | $6S_{1/2}$ nm |
|---|---|---|---|---|---|---|
| $5P_{1/2}$ | 794.9789 | | | | | |
| $5P_{3/2}$ | 780.2415 | | | | | |
| $4D_{5/2}$ | | | 1529.3658 | | | |
| $4D_{3/2}$ | | 1475.6447 | 1529.2615 | | | |
| $6S_{1/2}$ | | 1323.8791 | 1366.8737 | | | |
| $6P_{1/2}$ | 421.67261 | | | | 2293.877 | 2791.292 |
| $6P_{3/2}$ | 420.29891 | | | 2253.578 | 2253.805 | 2732.180 |
| $5D_{3/2}$ | | 726.1030 | 776.1570 | | | |
| $5D_{5/2}$ | | | 775.9786 | | | |
| $7S_{1/2}$ | | 728.2002 | 741.0211 | | | |

As used herein, IR-A (800 nm--1400 nm), IR-B (1400-3000 nm) and IR-C, (3000 nm--10,000 nm). As used herein, near-IR means 700-5000 nm; mid-infrared means 5000-25,000 nm; far infrared means 25,000-100,000 nm. The electronic transitions for $^{85}$Rb have the lowest energy of 9,186 nm or 3.1125 kcal/mol (0.135 eV or 1,088.6 cm$^{-1}$, or 32,636 GHz) and can qualify as IR-C and or mid-infrared transitions. Using Russel-Saunders notation, the $5S_{1/2}$ electronic state is a doublet and should be written as: $5\ ^2S_{1/2}$.

Similar transitions are allowed for the $^{87}$Rb isotope (abbreviated set; see FIG. 1 for a more detailed set) and are:

| $^{87}$Rb | $5S_{1/2}$ nm | $5P_{1/2}$ nm | $5P_{3/2}$ nm | $6P_{1/2}$ nm | $6P_{3/2}$ nm |
|---|---|---|---|---|---|
| $5P_{1/2}$ | 794.97891 | | | | |
| $5P_{3/2}$ | 780.24148 | | | | |
| $6P_{1/2}$ | 421.67261 | | | | |
| $6P_{3/2}$ | 420.29891 | | | | |
| $5D_{3/2}$ | | 762.10300 | 776.15702 | 5036.629 | 5241.241 |
| $5D_{5/2}$ | | | 775.97862 | | 5233.117 |
| $7S_{1/2}$ | | 728.20022 | 741.02112 | 3851.552 | 3970.072 |

Those transitions that are so-called forbidden may still be observed under laser radiation, but their emissions and absorption coefficients are rather weak and do not significantly contribute to the chromaticity coordinates attained (in the instant invention) with the use of rubidium vapor emission as tertiary radiation.

The Russel Saunders coupling terms as summarized for a small set of configurations:

| Configuration of valence electrons | Allowable Terms (States) |
|---|---|
| s | $^2$S |
| $s^2$ | $^1$S |
| $p^1$ or $p^5$ | $^2$P |
| $p^2$ or $p^4$ | $^3$P, $^1$D, $^1$S |

| Configuration of valence electrons | Allowable Terms (States) |
|---|---|
| p³ | ⁴S, ²D, ²P |
| p⁶ | ¹S |

The electronic configuration of one $^{85}$Rb electronic state is the elevation of an electron from the 5s orbital to a 5p orbital: $1s^2\, 2s^2\, 2p^6\, 3s^2\, 3p^6\, 4s^2\, 3d^{10}\, 4p^6\, 5s^1$ to $1s^2\, 2s^2\, 2p^6\, 3s^2\, 3p^6\, 4s^2\, 3d^{10}\, 4p^6\, 5s^0\, 5p^1$ (no 5s electron). There are two possible states from this electronic configuration: $^2P_{1/2}$ or $^2P_{3/2}$. When the orbital angular momentum is L=1, then the total angular momentum is 3/2 for an electron with spin 1/2. When the orbital angular momentum is L=0, then the total angular momentum is 1/2 for an electron with spin 1/2. For the excited state electronic configuration $1s^2\, 2s^2\, 2p^6\, 3s^2\, 3p^6\, 4s^2\, 3d^{10}\, 4p^6\, 5s^0\, 5p^1$, then L=1 (the unpaired electron is in the p orbital means land $L=\Sigma l_i$ and L=1). When L=1, the state is a P state. Hence there are two states of angular momentum, 0 and 1, and the nomenclature is $^2P_{1/2}$ and $^2P_{3/2}$. To include the principal quantum number, the states to which the excitation of the electron from the 5s to the 5p orbital are $$5^2P_{1/2}$$

and $$5^2P_{3/2}.$$

For $^{85}$Rb these transition are $$5^2S_{1/2}$$

to $$5^2P_{1/2}$$

and $$5^2S_{1/2}$$

to $$5^2P_{3/2},$$

794.9789 nm and 780.2415 nm, respectively.
For $^{87}$Rb, these transition are:

$$5^2S_{1/2}$$

to $$5^2P_{1/2}$$

and $$5^2S_{1/2}$$

to $$5^2P_{3/2},$$

794.97891 nm and 780.24148 nm, respectively.

For the excited state electronic configuration $1s^2\, 2s^2\, 2p^6\, 3s^2\, 3p^6\, 4s^2\, 3d^{10}\, 4p^6\, 5s^0\, 6p^1$, a similar schema is used, and the state transitions become $$5^2S_{1/2}$$

to $$6^2P_{1/2}$$

and $$5^2S_{1/2}$$

to $$6^2P_{3/2}.$$

For $^{85}$Rb these transition are:

$$5^2S_{1/2}$$

to $$6^2P_{1/2}$$

and $$5^2S_{1/2}$$

to $$6^2P_{3/2},$$

421.67261 nm and 420.29891 nm, respectively. For $^{87}$Rb, these transition are:

$$5^2S_{1/2}$$

to $$6^2P_{1/2}$$

and $$5^2S_{1/2}$$

to $$6^2P_{3/2},$$

421.67261 nm and 420.29891 nm, respectively.

The inventor uses the terminology second resonance doublet and first resonance doublet to speak of the doublets 420 and 421 nm, and, the doublets 794 and 780 nm, respectively. FIG. 1 shows the allowed absorption and emission spectral transitions, in nanometers, for rubidium vapor.

Summary of Steps Required in the Instant Invention

The instant invention teaches a microelectronic device that comprises:

1. a primary radiation solid-state source that generates primary radiation; preferable at a wavelength that a human observer considers is violet or blue;
2. a second radiation source that generates second radiation; preferably one that absorbs and scatters radiation that a human observer considers is violet or blue and which emits light that a human observer considers is green or yellow;
3. a tertiary radiation source that generates tertiary radiation; preferably one absorbing light that a human observer considers is violet or blue, and, or one absorbing light that a human observer considers is green or yellow, and one that emits light that a human observer considers is deep red and or which emits radiation bathochromic to deep red and less than 10,000 nanometers in wavelength;
4. a first optically-transmissive enclosure that comprises a primary radiation source;
5. a second optically-transmissive enclosure that comprises a region of space that is a vacuum or a gas and which said second enclosure further comprises luminescent material;
6. a third optically-transmissive enclosure that comprises a region of space that is a vacuum or a gas and which further comprises a source of alkali metal vapor either permanently or when in operation;
7. primary, second, and or third optically-transmissive enclosures in a nested relationship or not;
8. exemplary embodiments whereby an outer-most optically-transmissive enclosure that comprises within its volume of space said primary, second and or third enclosure in a nested relationship with each other or not;
9. a primary radiation which comprises ultraviolet and or violet or blue radiation, either of which is incident upon a second radiation source;
10. a luminescent material that emits spontaneously or with stimulation second radiation and which is located within the material that comprises the walls of an enclosure, in particular but not necessarily limited to the second enclosure, or otherwise occupies the region of space defined by the boundaries of an enclosure, in particular but not necessarily limited to the second enclosure;
11. a gas derived from alkali metal solid or liquid upon which is incident primary radiation and second radiation, and which responsively emits spontaneous luminescence, whereby said spontaneous radiation is tertiary radiation;
12. a source of heat or a source of thermal radiation;
13. whereby said outermost enclosure comprises said microelectronic device and from which all wavelengths of primary, secondary, and tertiary radiation mix to form a complex mixture of radiation exiting from the outermost enclosure.

Whereas the instant invention uses blue or violet light emitting diodes to generate blue and red light, the latter through down-conversion from Rubidium Vapor, the vaporization of which cools the heat generated by the solid-state device, as detailed herein, a completely different system with different results has been previously described. Marcus B. Kienlen, Noah T. Holte, Hunter A. Dassonville, Andrew M. C. Dawes, Kurt D. Iverson, Ryan M. McLaughlin, and Shannon K. Mayer in Am. J. Phys. 81 (6), June 2013, describe collimated blue light generation in rubidium vapor using two co-incident lasers operating in the red at 780.2 nm and 776.0 nm, to populate the $5D_{3/2}$ state (with an excited state lifetime of 26 nanoseconds) and subsequently the $5D_{5/2}$ state (from the originating $5S_{1/2}$ state), followed by internal conversion (doublet-to-doublet transition) to the $6D_{3/2}$ state. This $6D_{3/2}$ state, with an excited state lifetime of 112 nanoseconds, is lower in energy by 5.498 kcal/mol than the $5D_{5/2}$ (itself with an excited state lifetime of 240 nanoseconds) and subsequently emits at 420.2 nm when repopulating the $5S_{1/2}$. In contrast, as well, with the instant invention, the Rubidium vapor is externally heated with a heat-generating heater—in other words heat from a light-emitting diode is not cooled by the vapor as in the instant invention.

Terms, As Used Herein

As used herein, a rubidium element is that material that is one of the one hundred and eighteen known elements in the Chemistry Periodic Table of Elements, said element of rubidium is one that is a spectroscopic doublet, and which emits spontaneous or stimulated atomic emission, upon excitation to excited electronic states, the many of which are revealed and summarized in FIGS. 1, 3 and 4, and as described in more detail herein.

As used herein, elements are pure substances with specific properties. Atoms are the smallest units of elements that still retain the element's properties. Atoms contain electrons, neutrons, and protons. Each element is defined by the number of protons in its nucleus.

As used herein, a radiation source is that component which generates electromagnetic waves, or photons, as the preference may be, due to a stimulation from energy, including electrical energy or electromagnetic waves, and which said electromagnetic waves so generated carries entropy.

As used herein, the term deep red means absorption or emission of radiation between 750 nm and 800 nm.

As used herein, infrared means absorption or emission of radiation bathochromic to 800 nm.

As used herein, bathochromic means lower in energy and greater in wavelength than a cited energy or wavelength, respectively. In contrast, hypsochromic means greater in energy or lower in wavelength than a cited energy or wavelength, respectively.

As used herein, an alkaline metal is a Group 1 element that is not hydrogen. All alkali metals have an unpaired electron in its respective valence s orbital.

As used herein, an atomic luminescence, which includes atomic fluorescence and atomic phosphorescence, is the spontaneous emission from free atoms existing, when in its ground electronic state (prior to absorption of radiation), without coordination, complexation nor association with any stabilizing ligand or atom of a different atomic number, whether or not the ligand is organic, such as in an organometallic moiety or inorganic or ceramic moiety, other than itself. When the atomic luminescence displays a Stokes shift it is not due to the presence of phonons, which are distinctly absent in atomic luminescence as used herein, in contrast to phosphors whose Stokes shift are supported by the presence of phonons, to dissipate the electronic energy lost. By way of example, Hg emission in a typical gas discharge lamp represents atomic luminescence as there is no stabilizing moiety, other than other Hg atoms, to which electronic energy can be dissipated into vibrational energy. When the concentration of Hg atoms are high, radiation imprisonment occurs, but this is due to the energy transfer from one Hg atom to another, resulting in the appearance of a Hg radiative lifetime longer than that at dilute concentrations. When Hg excited states are quenched by moieties other than Hg, the radiative lifetime normally decreases when compared to the absence of a quencher and the luminescence that follows is not atomic luminescence, although both may coexist at the same time (i.e.; atomic luminescence and molecular luminescence emanating from the quencher or quenchers). In contrast, for a phosphor the luminesce that takes place is not atomic luminescence as the luminescent moiety is strongly influenced by the phonons which couple with the excited states so formed. By way of a differentiating example, the phosphor $Ce^{3+}$:YAG involves luminescence from an ionized Ce (cerium) atom complexed with and influenced by the yttrium aluminum garnet crystal structure associated with the $Ce^{3+}$ ion. Whereas we define $Ce^{3+}$ as not being of atomic fluorescence due to its association with the YAG crystal, we note that Ce metal itself is readily prepared from ores and is easily isolated in atomic form. The strongest atomic absorption and atomic emission is at 570 nm. The radiation emitted by alkali metal vapor, including rubidium metal vapor, is considered to be atomic luminescence. By definition, then, tertiary luminescence is defined to be atomic luminescence emanating from a third enclosure whereby the emission exists as a spectroscopic doublet. Dimers of alkali metals that emit upon excitation are also called atomic luminescence.

As used herein, a phosphor luminescence (luminescence from a phosphor) is that radiation emitted by a luminescent material, a distinct molecule or a complex or a compound whereby any localization of the excited states is influenced by the crystals, ligands, complexes or adjacent structures such that vibrational modes, phonons, of deexcitation exist. By way of example, the metavanadate material that emits white light (broad emission) $AVO_3$ where A includes potassium, K, rubidium, Rb, and Cesium, Cs, is a phosphor. [Nakajima, et. al., 2008]. The luminescent element in these cases are the vanadium ions within the phosphor framework. By definition, we also consider quantum dots and perylene dyes to be phosphors. The synthesized CsPbCl3:($Rb^+$, $Mn^{2+}$) perovskite quantum dot (PQD) is another phosphor by the definition as used herein. This perovskite quantum dots possesses enhanced photoluminescence quantum yield of 71% due to the reduction of intrinsic defect states in co-doped perovskite quantum dots. White light emission of a $CsPb(Cl/Br)_3$:($Rb^+$, $Mn^{2+}$) perovskite quantum dot is achieved by anion exchange reaction and the constructed WLED exhibits the CIE coordinate of (0.33, 0.29) and the correlated color temperature of 5497 K. [Na Wu, et. al., 2023]

As used herein, a luminescent element is that atomic or molecular component of a luminescent material to which the radiative decay is said to originate.

As used herein, a nested relationship means a group of objects made to fit one within another, the objects being enclosures. As meant herein, stacked relationship means a group of objects in an orderly vertical pile or heap. As meant herein, an array relationship means a group of objects in an orderly horizontal positioning.

As used herein, an enclosure means something that surrounds a space, or a volume of space, so as to confine that which is within the space, and which forms a barrier to escaping from the space so confined. That which is within the space so confined may be nothing, in other words a vacuum devoid of any appreciable matter or measurable gas. The enclosure may also comprise a partial vacuum or a region of gas under pressure greater than atmospheric pressure. The enclosure may contain a liquid or a solid to be vaporized or sublimed, respectively, into a gas so constrained, upon operation of the microelectronic device. The enclosure is formed by walls which have an outer face and an inner face. Each enclosure may have its own walls, the number and dimensions of which depend on the shape and nesting type of said enclosure. In some exemplary embodiments, an enclosure may share a wall with another enclosure. In the case of nested enclosures, as shown in FIG. 2, the enclosures share walls, such that the inner face of said wall constrains a volume of space in one enclosure different than the outer face of said wall which constrains a volume of space in a different enclosure.

As used herein, nesting is a set of enclosures one fully within another.

As used herein, an optically transmissive enclosure is an enclosure whose walls do not fully block the transmission of radiation through the enclosure although they may be partially blocking any or all wavelengths of radiation.

As used herein, radiation means the emission of energy as electromagnetic waves or as moving subatomic particles, especially high-energy particles which cause ionization.

As used herein, electromagnetic waves mean light or the propagation of light through space or a vacuum or through an atmosphere of particles and or gases.

As used herein, an atmosphere of gases means a region of space or a volume of space that contains gas which itself may be delivered from a liquid or a solid element such that the heat necessary to vaporize or sublimes comes from within or about the microelectronic device, such that said utilization of heat to vaporize or sublime, or both, cools the device.

As used herein, the utilization of heat is the transfer of unwanted thermal energy, formed due to microelectronic device inefficiencies, including the less than unitary efficiency of luminescence at a p-n junction, or at a luminescent material in a receiving relationship with the luminescence emanating from a p-n junction, into heat of vaporization, heat of sublimation, or heat of fusion. For the material rubidium, a heat of vaporization is known to be 16.5 kcal per mole and an entropy of vaporization is known to be 17.2 kcal/K·mol. The enthalpy of sublimation for rubidium is known to be 19.36 kcal/mol. The thermodynamic properties of rubidium are reported in J. Chem. Eng. Data 1967, 12, 3, 352-356.

As used herein, the matter (or material) that is vaporized or sublimed may also be a material that is luminescent when said material is in a receiving relationship with luminescence emanating from a p-n junction, or in a receiving relationship from luminescence emanating from another luminescent material in a receiving relationship with the luminescence emanating from a p-n junction.

As used herein, an element means each of more than one hundred substances that cannot be chemically interconverted and are primary constituents of matter. Each element is distinguished by its atomic number, i.e., the number of protons in the nuclei of its atoms.

As used herein, radiance means, as used in radiometry, the radiant flux emitted by a given surface, per unit solid angle per unit projected area. The SI unit of radiance is the watt per steradian per square meter ($W \cdot sr^{-1} \cdot m^{-2}$). It is a directional quantity: the radiance of a surface depends on the direction from which it is being observed. The related quantity spectral radiance is the radiance of a surface per unit frequency or wavelength, depending on whether the spectrum is taken as a function of frequency or of wavelength. Historically, radiance was called "intensity" and spectral radiance was called "specific intensity". Many fields still use this nomenclature. "Intensity" has many other meanings in physics, with the most common being power per unit area.

As used herein, alkali metal vapor means a gas in a vacuum or under pressure that comprises an element of an alkali metal atom as opposed to an anion or cation of said atom and wherein said alkali metal atom is comprised of rubidium atom, potassium atom, or sodium atom, either in a pure thermodynamic state or in an alloy of alkali metal thermodynamic states, either in their respective ground states, from which said atoms may absorb radiation, or excited electronic states, from which atoms may emit radiation. Not included in the definition of alkali metal vapor are the anion or cation of the ground electronic states of an alkali metal, as alluded to above, in a vapor thermodynamic state, but may include Rydberg excited states which are electronic excited states known to be essentially ionized, but which emission of radiation may still take place. [As used herein, Rydberg atoms are excited atoms with one or more electrons that have very high principal quantum number but where the high energy electron is still influenced by the nucleus of the atom and the atom itself. Rydberg atoms of rubidium metal may transfer its energy to the ground state of organic molecules including phosphors by Forster Resonance Energy Transfer.].

As used herein, an alkali metal comprises the light metal elements lithium atom, sodium atom, potassium atom, and the heavy elements rubidium atom and cesium atom. Formally, Francium is also an alkali metal but it has a very short radioactive lifetime and is not available in any appreciable amount, although it too has a persistent absorption and emission spectrum with lines at 422 nm and 432 nm as well as 718 nm and 817 nm.

As used herein, an enclosure collar is a component somewhat resembling a garment collar in shape used to restrain motion or hold other elements of the light-emitting diode enclosures or enclosure walls in place and which captures and transfers heat around the surfaces to which it is clamped. More generally, a component designed to bind or constrict or to press two or more parts together to hold them firmly. As used herein, an enclosure collar acts both as a clamp as well as a reservoir of heat from which it is transferrable to the enclosures so that heat originating from the p-n junction and the site of the Stokes shift ultimately is transferred to the rubidium metal solid or liquid (or alkali metal alloy), so as to cool the device and to vaporize the rubidium or alkali metal alloy.

As used herein, a phosphor is a molecule or a complex such as an organometallic complex, both more generally called a chemical substance, that exhibits the phenomenon of luminescence; it emits light spontaneously some time after being exposed to some type of radiant energy. The term is used both for fluorescent or phosphorescent substances which glow on exposure to ultraviolet or visible light or infrared light, and cathodoluminescent substances which glow when struck by an electron beam (cathode rays) in a cathode-ray tube. When a phosphor is exposed to radiation, the orbital electrons in its molecules are excited to a higher energy level; when they return to their former level, they emit the energy as light usually of a lower energy. Phosphors can be classified into two categories: fluorescent substances which emit the energy immediately and stop glowing picoseconds or nanoseconds after the exciting radiation is turned off, and phosphorescent substances which emit the energy after a delay, so they keep glowing after the radiation is turned off, decaying in brightness over a period of milliseconds to days. Phosphorus, the light-emitting atomic element for which phosphors are named, ironically emits light due to chemiluminescence, not phosphorescence.

As used herein, a source of second radiation in the instant invention is a phosphor and is resident either in a second enclosure, or in certain embodiments, as a layer on the light-emitting diode, the latter of which is within a first enclosure. The source of primary radiation is a light-emitting diode. The source of tertiary radiation is a vapor of an alkali metal, preferentially rubidium vapor, which is constrained within a third enclosure as is the source of the alkali metal vapor.

Photoluminescence, as used herein, is a more general term that encompasses luminescence as a consequence of the production or generation of an excited state, usually initiated by an incident photon, but also as a consequence of energy transfer of various other types. Thermal radiation, in contrast, is radiation as a consequence of heat or more specifically the temperature of a matter that generates the thermal radiation. The radiative power of thermal radiation so generated is a function of the fourth exponential power of the temperature of the aforesaid matter. The radiative power of the thermal radiation so generated can be related to the energy density of the thermal radiation as it traverses a volume of space as radiation, of course, travels at the speed of light (in a vacuum or in a medium). Consequently, thermal radiation is a form of energy transfer called heat dissipation, from one volume to another. Like all radiation or luminescence, thermal radiation is a process that the intervening medium is generally transparent to and does not aid, participate in or actively propagate and hence it is the only means of heat dissipation generally independent of the molecular motion or kinetic energy. Radiation or light generally travels through million miles of the vacuum of space unchanged unless the atmosphere such as Earth's through which it travels scatters the electromagnetic waves, as if they were particles, said scattering can be elastic or inelastic, or have atoms or molecules that have an absorption spectrum that overlaps the frequency of radiation incident thereupon.

As used herein, alkali metal vapors are not phosphors.

As used herein, particles as a consequence of radiative decay from tritium, by way of example, can be the incident source that provide energy to populate the excited states of scintillation medium which comprises diphenyloxazole or 1,4-di-2-(5-phenyloxazole)benzene POPOP, subsequent to which visible light is produced. This process is called radioluminescence. This over 100 year old processes have recently been explained. [Niedzwiedzki, et. al., 2022.]. The scintillation wavelength-shift is simply luminescence involving both singlet and triplet states.

As used herein, a more formal definition of fluorescence is an emission that occurs without a change in spin multiplicity and phosphorescence is an emission that occurs with a change in spin multiplicity.

As used herein, photons are light or radiation with an emphasis on the particle-like characteristics revealed under certain experimental conditions as opposed to the wave-like characteristics revealed under a different set of experimental conditions.

As used herein, a light-emitting diode is a semiconductor device that emits light when current flows through it. Electrons (acting as a radical anion) in the semiconductor recombine with electron holes (acting as a radical cation), releasing energy in the form of electromagnetic waves.

As used herein, borosilicate glass means high-borate borosilicate glass with an optimum composition of 62.7 weight percent $SiO_2$, 26.9 weight percent of $B_2O_3$, 6.6 weight percent $Na_2O$, and 3.5 weight percent of $Al_2O_3$ although different composition (component) amounts are suitable as well. The inventor of the instant invention does not seek to be limited in the breadth of the glasses that may be used to create the required enclosures as a wide range of glass are satisfactory provided the glass is reasonably non-reactive with 1) alkali metal atoms or 2) degradation products of alkali metal atoms.

BRIEF DESCRIPTION OF THE DRAWINGS

FIG. 1 shows a set of quantum mechanical allowable electronic excitation and emission transitions for rubidium atoms.

DETAILED DESCRIPTION AND BEST MODE OF IMPLEMENTATION

Figure 2:
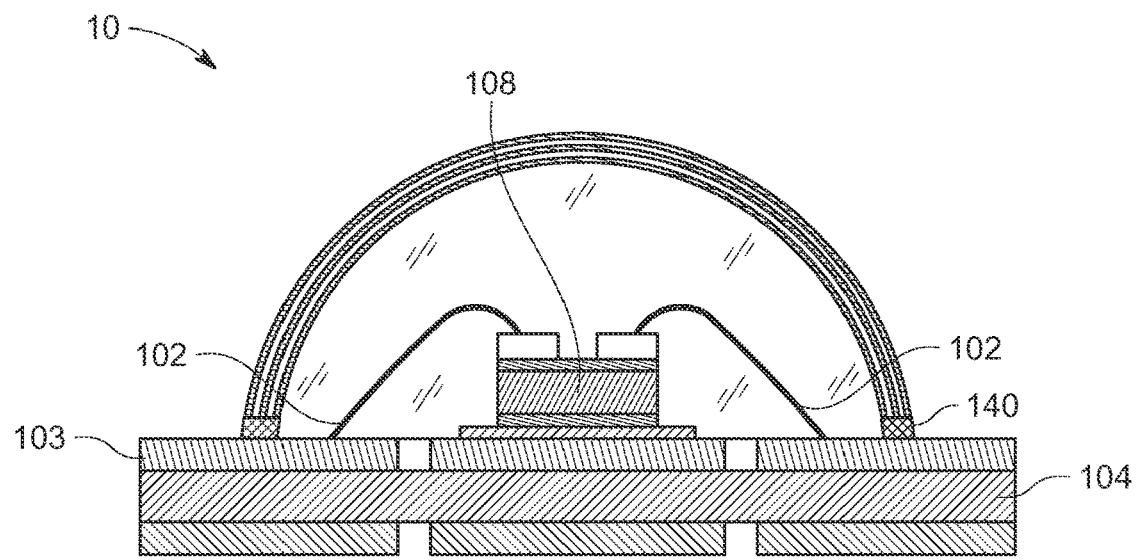
FIG. 2 shows a microelectronic device "10", a complete microelectronic device, with one light-emitting diode array within a first enclosure, which in of itself sits within a second enclosure which in of itself sits within a third enclosure. Also shown is an optional metallic collar around the enclosures used to localize thermal energy for usage in powering a phase transition for rubidium atom metal.
Figure 2:
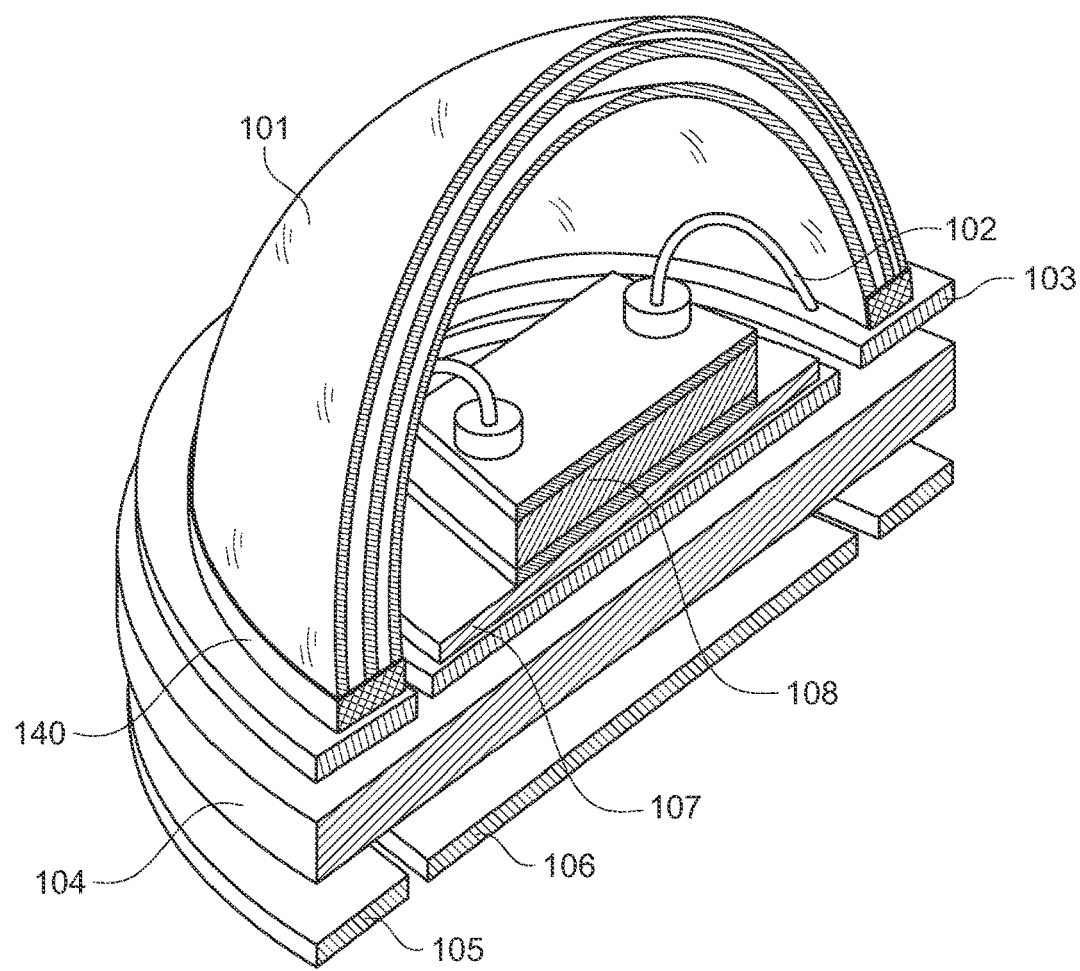

The alkali metals consist of the chemical elements lithium, sodium, potassium, rubidium, cesium, and francium. Together with hydrogen they constitute group 1, which lies in the s-block of the periodic table. The interest of the instant invention are the alkali metals alloys and or the rubidium element. Alloys of alkali metals exist that melt as low as −78° C. The alloys of interest to the instant invention are those comprising the specific alkali metal known as rubidium.

The instant invention requires rubidium atoms. Rubidium is present in the soil on Earth. The percentage of rubidium in the earth is roughly 1/2500th that of potassium or sodium. Rubidium has acceptable toxicology as it is "present in virtually all animal tissue in the range of from $2\times10^{-3}$ to $6\times10^{-3}$ percent (dry weight). It is thus apparent that the abundance of rubidium relative to potassium is significantly greater in living tissues than in the terrestrial environment." [Relman, A. S., 1956].

When fed to animals in large quantity, rubidium is only slowly excreted in the urine and accumulates to a considerable degree in muscle and in most other soft tissues with a distribution similar to that of naturally occurring potassium. [Relman, A. S., 1956]. Rubidium salts, as rubidium is found in nature, are generally a surrogate for potassium salts in animals and are well tolerated. Thus, one contrasts this heavy element against mercury, another atom with many excited states that luminesce in regions of utility, but which is highly toxic. Of course, alkali metals need to be handled with care, as has been accomplished with sodium vapor gas discharge lamps.

In the instant invention, the emissions from alkali metals like rubidium are tertiary radiation but provide the unique characteristics of irradiance required by the multitude of applications serviced. The source of primary radiation in the instant invention is a light-emitting diode, preferably a visible light emitting die, even more preferable a light emitting diode that is perceived by a human observer to demonstrate a violet or blue in emission color, but not one that emits red light, deep red light, nor monochromatic infrared light. If the light-emitting diode is one perceived by a human observer to emit light that is blue in color, the spectral distribution of said diode is broad enough to provide some emissions that overlap with the absorption spectrum of the luminescent materials and the rubidium vapor. If the light-emitting diode is one perceived by a human observer to emit light that is violet in color, the spectral distribution of said diode need not be so broad as the rubidium vapor absorption spectrum overlaps with that which is characterized as a violet light. There are many means to produce violet or blue light from semiconductor devices called light-emitting diodes. The most relevant ones, however, and those used in the instant invention, are those comprising GaN, InGaN, InAlGaN and or SiC. [See, for example, Shuji Nakamura, Masayuki Senoh, and Takashi Mukai who authored "High-power InGaN/GaN double-heterostructure violet light emitting diodes" as can be found in Appl. Phys. Lett. 62 (19), 10 May 1993.]

The source of second radiation is a luminescent material as defined herein. The source of second radiation also is a source, when and where irradiated by the primary radiation, of a Stokes shift. A source of the Stokes shift is within an optically-transmissive enclosure, preferentially an enclosure that does not also comprise a light-emitting diode nor a vapor of alkali metals or rubidium. However, there are embodiments to the instant invention whereby the source of a Stokes shift is within the same enclosure as the light-emitting diode. The instant invention also requires a luminescent gas whose emission is a doublet emission. It is preferential that a luminescent gas be an alkali metal; it is more preferential that an alkali metal be a rubidium vapor. That is to explicitly say a luminescent gas whose emission is a doublet emission is a source of tertiary radiation.

Rubidium Vapor

In the instant invention, rubidium is used as a gas in order to obtain the desired red luminescent elements. An enclosure is required to constrain a gas. While this enclosure may include other elements that are required for the claimed device, it is preferred that an enclosure that comprises a rubidium vapor not include a source of primary radiation and a source of second radiation. It is preferable that there be a multiple number of enclosures; it is more preferential that the multiple enclosures be nested within each other. To constrain a rubidium vapor, it is most desirable to use a glass based on aluminum and silicon and to be defined hereinafter.

In one exemplary embodiment, a microelectronic device comprises a first optically-transmissive enclosure-whose volume of space within is called an interior space-which contains a source of a primary radiation, a light-emitting diode. A primary optically-transmissive enclosure is within a second optically-transmissive enclosure that comprises a source of a second radiation, itself activated photo-physically by absorption of part, or all, of radiance emanating from a light-emitting diode. Some primary radiation is also scattered by a source of second radiation, a luminescent material, and ultimately exits a second optically-transmissive enclosure as well as a microelectronic device. A luminescent material is one that has a Stokes shift and heat generated at a source of a Stokes shift is transferred to a third optically-transmissive enclosure, said third enclosure may not be the outermost enclosure for those exemplary embodiments that comprise an external housing, called a luminaire, that encloses an entire microelectronic device which itself comprises multiple optically-transmissive enclosures within optically-transmissive enclosures and an array of optically-transmissive enclosures. A luminaire is one that comprises at least one microelectronic device.

Rubidium vapor is obtained by heating rubidium solid which is readily available as a side-product of the manufacture of lithium metal. Rubidium (atomic symbol: Rb, atomic number: 37) atom has a radius of 248 picometers and a Van der Waals radius of 303 picometers. Rubidium is highly reactive, with properties like other Group 1 alkali metals, e.g., rapid oxidation in air and reaction with water. In its elemental form, rubidium has a gray, white appearance. Rubidium is found in the minerals lepidolite, leucite, pollucite, carnallite, and zinnwaldite as well as some potassium minerals. The name rubidium, originates from the Latin word rubidus, meaning "dark or deepest red." The melting point of rubidium metal is 38 to 39 degrees C., near the physiological temperature of humans. The boiling point at atmospheric pressure is 686 degrees C.

There are few independent minerals of rubidium, which generally coexist with rare metals such as lithium, beryllium, cesium, tantalum and niobium, and occur in pegmatites (lepidolite, zinnwaldite and pollucite) which are composed of quartz, feldspar, and mica, and have a similar silicic composition to granite. The aforementioned and their atomic compositions are: lepidolite $(K(Li,Al)_3(Si,Al)_4O_{10}(F,OH)_2)$, zinnwaldite $(KLiFeAl[AlSi_3O_{10}] (F,OH)_2)$, and pollucite $(Cs(AlSi_2O_6) \cdot H_2O)$. Rubidium is also found in biotite, and salt lake and seawater. With the increasing market for lithium metal, it is expected that the commercial sourcing of rubidium will dramatically improve as a by-product of lithium mining. [Liu, et. al., 2022]. Rubidium used in the instant invention is already commercially available from several sources and will be used typically as is or after distillation under vacuum. A source is ESPI Metals, 1050 Benson Way Ashland, Oregon 97520. The rubidium metal is stored in a glass ampul under an argon atmosphere.

McCoy, Jr. H. E. and Hoffman, E. E., of the Oak Ridge National Laboratory published in 1955 an AEC Research and Development Report entitled Handling Techniques for Rubidium and this technical document provides the necessary guidance to manufacture a microelectronic device comprising rubidium. The art taught by these authors is included herein by reference. FIG. 7 from said report is a photograph of a distillation apparatus used to vacuum distill and purify rubidium metal. Filtration of rubidium metal through a 50-micron glass filter under an inert atmosphere is effective if the inert atmosphere is under sufficient pressure to drive the liquid through the filter. When hydrogen is used as the atmosphere, rubidium hydride is found to contaminate the rubidium metal, in the same manner that sodium hydride forms under a hydrogen atmosphere. It is preferential to not use a hydrogen atmosphere as rubidium hydride so formed is a strong base. Residual amounts of rubidium are removed from handling containers by adding hexane first, followed by (slowly) ethanol to form rubidium ethylate which is again reacted with hydrochloric acid to form rubidium chloride. In this manner, pure rubidium is obtained to allow for the instant invention to be realized without the introduction of luminescence quenchers.

Rubidium metal easily melts near ambient temperature to form rubidium liquid. To go from a liquid state to a gas state near the operating temperature of light-emitting diodes requires constricting rubidium liquid in an optically-transmissive enclosure whereby a vacuum is at least $10^{-3}$ Torr, preferably $10^{-5}$ Torr. In the alternative, alloys of rubidium with either potassium or sodium or lithium have lower melting points than pure rubidium as a manifestation of melting point depression (the entropy of mixing). It is preferable that a rubidium vapor is mixed with vapor from Noble gases The vapor pressure of pure rubidium is: a) 76.85° C., 0.0000447 Torr ($4.4 \times 10^{-5}$ Torr); b). 101.9° C., 0.000263 Torr ($2.6 \times 10^{-4}$ Torr); c). 126.9° C., 0.00124 Torr ($1.2 \times 10^{-3}$ Torr); d). 151.9° C., 0.00486 Torr ($4.8 \times 10^{-3}$ Torr); e). 176.9° C., 0.0164 Torr ($1.6 \times 10^{-2}$ Torr); f). 201.9° C., 0.0487 Torr ($4.9 \times 10^{-2}$ Torr); and g). 226.9° C., 0.130 Torr ($1.3 \times 10^{-1}$ Torr). One atmosphere of pressure is 760 Torr. An enclosure wall of an optically-transmissive enclosure, that is in contact with the rubidium in Noble gas vapor, should be coated with a hydrocarbon layer or a salinized hydrophobic surface to ensure that the pure rubidium metal, obtained as described herein before, does not leach from a glass surface unwanted quenchers.

Alloys of Rubidium.

The inventor of the instant invention acknowledges the dissertation of Chen-Chao Hsu entitled "Solid-Liquid Phase Equilibria of the Sodium-Rubidium and Sodium-Potassium-Rubidium Alloy System", defended in August of 1969 with respect to a particular alloy that may be used as an alternative to pure rubidium metal: specifically sodium or sodium-potassium alloys. In the case of the former, the eutectic point occurs at 268.65±0.05 K with a 0.821 mole fraction rubidium in an Rb:Na alloy. It is on belief that the eutectic point for a variety of Rb:Na:K alloy to be at 248 K. See, also, Goates, et. al., 1969, Delawarde, Ott, et. al, as well as Goates, et. al., 1970. These alloys can be vaporized at low vacuums of $10^{-4}$ Torr. See also Ham et. al., 1962, as well as US20200345259A1. For temperatures below ambient, it is necessary that a vacuum in which the rubidium is placed be at $10^{-5}$ Torr to $10^{-6}$ Torr although when using an exemplary embodiment of an alloy, less demanding vacuums can be used. With respect to vacuums for rubidium atoms, reference is to a vacuum in which a Rb metal vapor is stored within its optically-transmissive enclosure.

FIG. 1 reveals the necessary electronic transitions that are allowable and include required transitions for a microelectronic device of the instant invention. FIG. 2 reveals two views of a complete microelectronic device "10". Included in the two views within FIG. 2 is an optional collar "140" which assists in the localization of heat so as to provide a source of thermal energy to support vaporization of a luminescent material into a luminescent vapor.

The other parts designated in complete microelectronic device "10" in FIG. 2 are:
"101"—An outside wall of a third optically-transmissive enclosure;
"102"—lead wires;
"103"—copper track;
"104"—substrate;
"105"—a terminal;
"106"—a thermal pad;
"107"—a thermally conductive adhesive;
"108"—a LED die.

Figure 3:
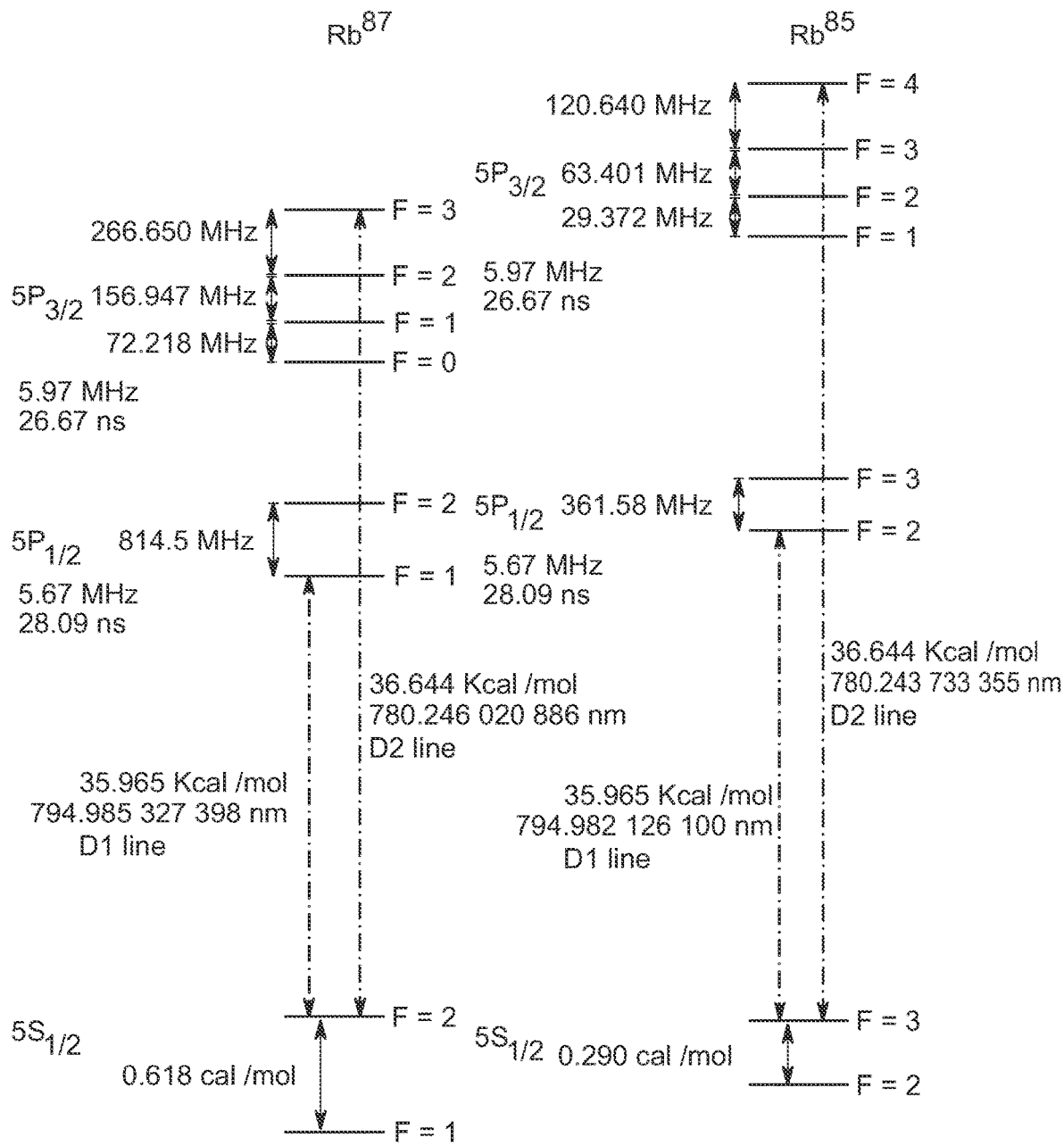
FIG. 3 shows the electronic excitation and emission transitions for rubidium atoms and which are of interest to the instant invention.
Figure 4:
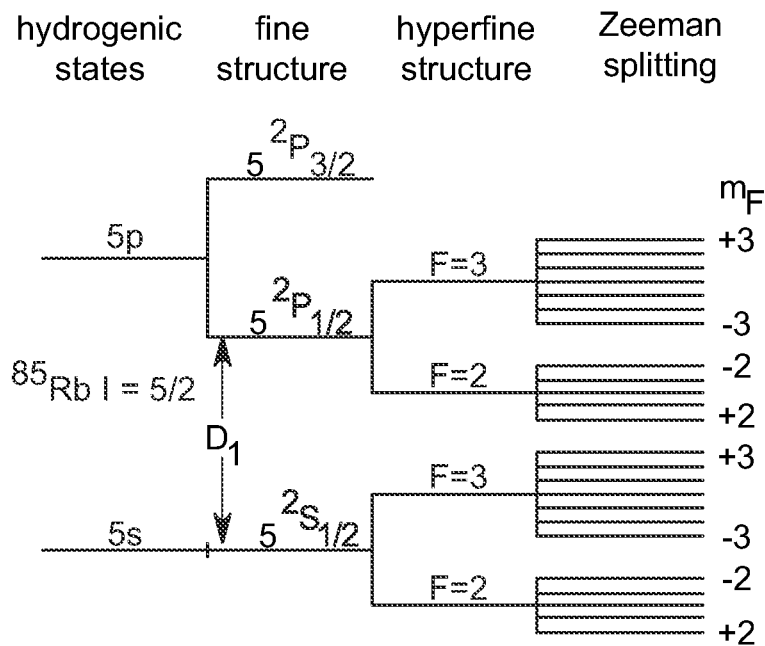
FIG. 4 shows the electronic excitation and emission transitions as impacted by electron spin-electron orbital coupling (fine structure), electron spin-nuclear spin coupling (hyperfine structure), and the Zeeman splitting of the hyperfine coupling due to the presence of an external magnetic field.
Figure 4:
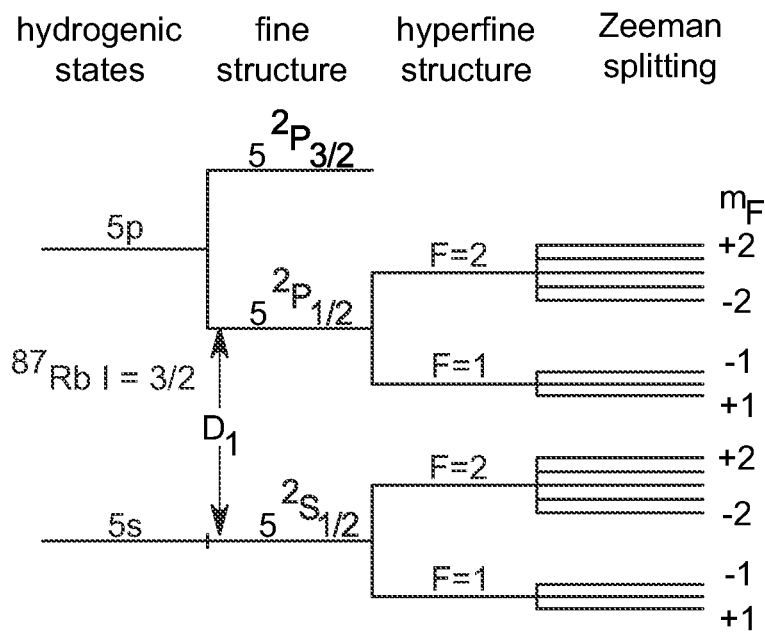

A preferential embodiment of the instant invention is for a rubidium vapor to be constrained by "101", an outside wall of an optically-transmissive third enclosure and to be within a volume of space of said third enclosure. From this volume of space, the electronic transitions between 35 and 37 kcal per mole, as defined by FIG. 3, take place after absorption of radiation from an applicable light-emitting diode (a primary radiation source) and a luminescent material (a second radiation source). FIG. 4 shows in more detail the electronic states applicable to a tertiary radiation source when one factors in fine structure, hyperfine structure and Zeeman splitting of the relevant hydrogenic states. Zeeman splitting is observed when the tertiary radiation source is exposed to a magnetic field greater than that of the Earth's magnetic field.

Figure 5:
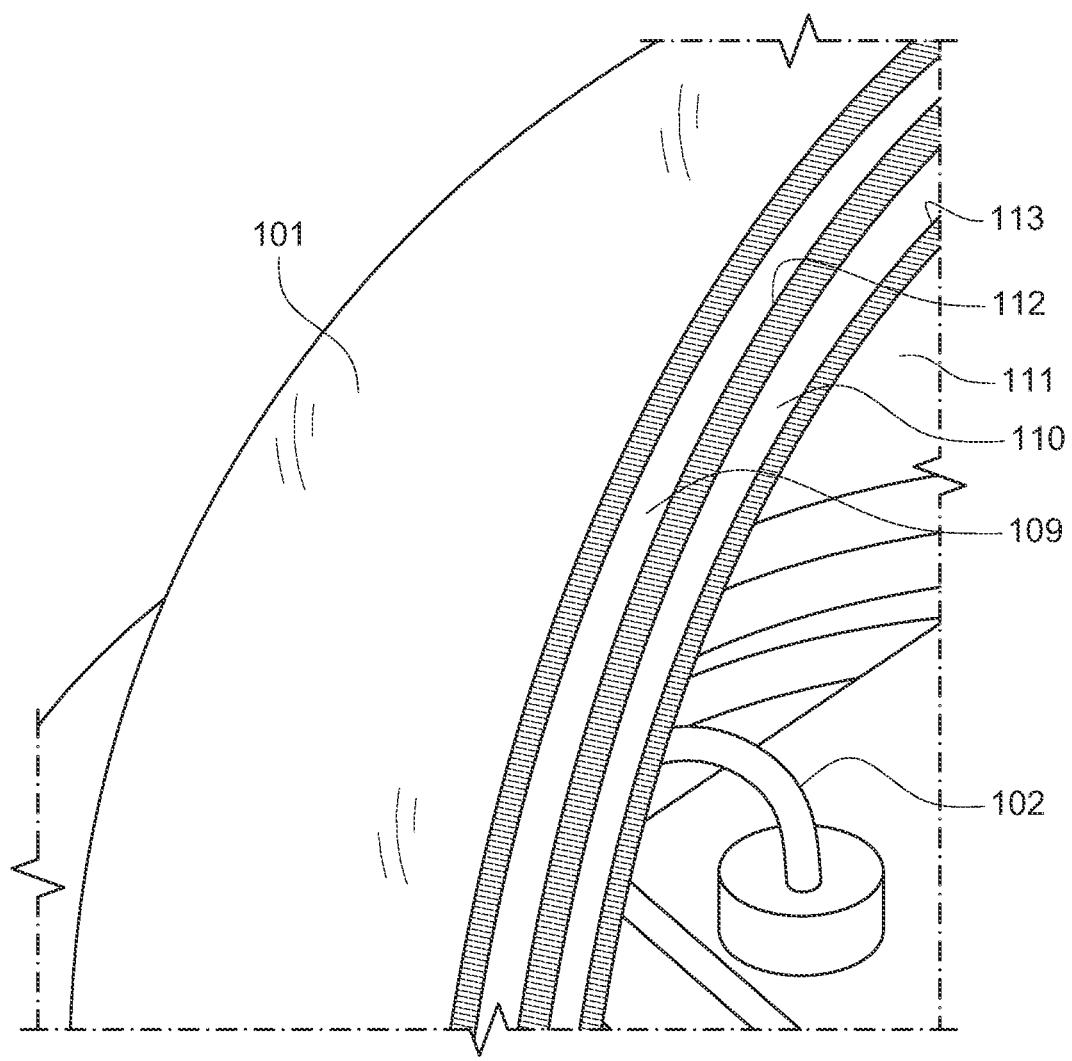
FIG. 5 shows a close-up view of a portion of a microelectronic device wherein the volume of space between the walls of a set of nesting enclosures is more evident.

FIG. 5 is a sectional and partial view of the complete microelectronic device "10" depicted in FIG. 2 (not delineated as "10" in FIG. 5 as the view is only partial and not complete), where the respective optically-transmissive enclosures are defined:
"109"—a third optically-transmissive enclosure, the volume of space within which is called an outermost space;
"110"—a second optically-transmissive enclosure, the volume of space within which is called an inner space;
"111"—a first optically transmissive enclosure, the volume of space within which is called an interior space;
"112"—an outside wall of second optically-transmissive enclosure;
"113"—an outside wall of first optically-transmissive enclosure.

The parts "101", and "102" in FIG. 5 are the same as that shown for these parts in FIG. 2.

FIG. 2 shows an exemplary embodiment "10" in the instant invention whereby optically-transmissive enclosures are in a nested relationship.

Optically-transmissive enclosure walls are generally comprised of a plastic or a glass except for the glass used for a third optically-transmissive enclosure. If a glass, generally a borosilicate glass or an aluminosilicate glass, but certain embodiments could be a quartz glass. In certain exemplary embodiments that inner or outer surface of an optically-transmissive enclosure, that is to say an inner or outer wall of an optically-transmissive enclosure, may be coated with a coating of hydrocarbons and or silyl-aliphatic hydrocarbons with an appropriate covalent linker. A particularly hydrophobic coating may be one that is a fluorinated hydrocarbon or a fluorinated silicone.

In certain exemplary embodiments, walls that form optically-transmissive enclosures may be comprised of a rubidium barium borate glass. The process to prepare the starting material for a glass of composition $RbBaB_7O_{12}$ polycrystalline sample involves a stoichiometric ratio of $Rb_2CO_3$, $BaCO_3$, and $B_2O_3$ (e.g.; for a small sample, 1:2:7 (2.31 g $Rb_2CO_3$, 3.95 g $BaCO_3$, and 4.87 g $B_2O_3$) which is mixed thoroughly. To decompose a carbonate, a mixed sample is held at about 400° C. over 12 h first. Then, it is elevated to about 600° C. for 24 h. Afterward, it wis increased to 750° C. for 1 week with intermittent mixing and grinding. This method was first reported in 2018. [See, for example, Yun Yang, Xiaoyu Dong, Shilie Pan, and Hongping Wu, The Rubidium Barium Borate Resulting from B7O15 Fundamental Building Block Exhibits DUV Cutoff Edge, Inorg. Chem. 2018, 57, 21, 13380-13385]. [Yang, et. al., 2018]

When the walls that define the boundaries of an enclosure are comprised of luminescent material, said enclosure are also said to be optically-transmissive and to comprise a luminescent material.

Returning to FIG. 2, a LED die "108" is one that when powered with an electrical current emits radiation in a visible region with a color that is often referred to as broadly blue, or less broadly, as violet. This LED die is usually made comprising GaN, Ga and N, or other metals such as In and Al, and or SiC, and a finished diode is obtainable from many sources including Marubeni (L420V-66-16100-110). The technology behind these LED dies is discussed in detail in the publication authored by DenBaars, et. al., 2013, the details of which are incorporated herein by reference.

Referring to "102" a set of lead wires, these bring power to a LED die "108" and provide the electromotive force necessary to create electrons and holes, whose recombination provides the energy of the resulting electromagnetic waves. The electrical current is delivered through lead wires, to contact points on a LED die from a copper track "103". A LED die "108" is mounted to a copper track using adhesive "107". The other side of a copper track "103" is mounted upon ceramic substrate "104", itself mounted onto terminal "105". The entire assembly may be mounted on a thermal pad "106". A first optically-transmissive enclosure "111" is formed by securing in place, onto the copper track, a primary wall "113" whose outer face forms part of a second optically-transmissive enclosure "110".

A ceramic substrate "104" should have (1) high thermal conductivity; (2) a coefficient of thermal expansion of the material to be close to that of a LED die chip; (3) good mechanical properties; and (4) low density. Aluminum as an encapsulating material has high mechanical strength, high heat dissipation capability, and high thermal conductivity, but its coefficient of thermal expansion is high. AlN for Aluminum Nitride has high thermal conductivity and a low thermal expansion coefficient close to that of the LED die and thus is preferable in exemplary embodiments of the instant invention.

Whereas thermal pads such as "106" may be used to control dissipation of the heat from a LED die, other exemplary embodiments of the instant invention dissipate heat into an optically-transmissive enclosure in which reside alkali metal vapor. Details on the incorporation of thermal pads for heat dissipation is provided in Górecki, et. al., 2020, which is incorporated herein by reference.

The key feature of thermal pads is their ability to change their physical characteristics. At room temperature these materials are firm and easy to handle. This allows more control when applying solid pads to a heatsink surface. A thermal material softens as it reaches component-operating temperatures. With the heat from the operating junctions, the phase-change material readily conforms to both surfaces. Dongguan Sheen Electronic Technology Co., Ltd. [No. 6, Yuanfeng Road, Yaole square, Liaobu Town, Dongguan, Guangdong, China] as a supplier of thermal pads for microelectronic devices as are many other suppliers in the industry supporting light-emitting diode microelectronic devices.

Referring again to FIG. 5, three optically-transmissive enclosures are formed by walls "113", "112" and "101".

An optically-transmissive enclosure "111" formed by wall "113" comprises a light-emitting diode or may contain an array of light-emitting diodes, although for sake of simplicity and clarity, FIG. 2 and FIG. 5 shows only a 1×1 array of a light-emitting diode within a first optically-transmissive enclosure formed by an hemispherical enclosure wall "113".

As used herein, an array of light-emitting diodes includes, by definition, a row and a column of light-emitting diodes including a 1×1 array, that is a unitary light-emitting diode in one optically-transmissive enclosure. In addition, in certain exemplary embodiments there are an array of nested optically-transmissive enclosures each with a first optically-transmissive enclosure containing an array of light emitting diodes, including a 1×1 array.

In other exemplary embodiments there are an array of light-emitting diodes in a first optically-transmissive enclosure and an array of nested optically-transmissive enclosures, including a triply nested enclosure, itself shown by walls "113", "112", and "101" in FIG. 5. The microelectronic device may comprise at least one, if not more, light-emitting diodes, whether in an array or not, in a first optically-transmissive enclosure. For the purpose of providing drawings without excessive detail obscuring essential parts, wherever a light-emitting diode with its power leads are shown, in certain exemplary embodiments, there may be more than one light-emitting diodes also having power leads. This is the practice regardless of whether the embodiment is taught by FIG. 2 or FIG. 5 in the Drawing. A set of nested optically-transmissive enclosures are labeled as "111", "110" and "109". Each of the cited enclosures is bounded by a wall, shown in FIG. 2 as shared walls—but some exemplary embodiments do not implement shared walls—has an inner surface and an outer surface, the latter of which is demarked in FIG. 5 as: a). outer surface of enclosure 109 is 101; b) outer surface of enclosure 110 is 112; and c) outer surface of enclosure 111 is 113.

Again, referring to FIG. 2, each wall also has an inner surface, for purpose of clarity, is not demarked in FIG. 2. Said walls, whose outer surface is defined as 112 or 113 or 101, are optically-transmissive and may comprise, without further demarcation, in of itself, a luminescent material that comprises a luminescent element.

In summary, referring to FIG. 5:

| Enclosure Number | Enclosure Name | Outer Surface of Wall |
|---|---|---|
| 109 | Third enclosure | 101 |
| 110 | Second Enclosure | 112 |
| 111 | First enclosure | 113 |

Referring to FIG. 2, within a first optically-transmissive enclosure "111" is a light-emitting diode under an atmosphere that is either a vacuum, a partial vacuum or greater than atmospheric pressure using a gas that is inert, a liquid that is inert or a polymeric resin that is inert. Referring to FIG. 2, a second optically-transmissive enclosure "110" preferably comprises a luminescent material required for a Stokes shift and either a vacuum, a partial vacuum or greater than atmospheric pressure using a gas that is inert, a liquid that is inter or a polymeric resin that is inert. In certain exemplary embodiments, a luminescent material is also coated on a light-emitting diode die "108", in a first optically-transmissive enclosure, and also comprised within a second optically-transmissive enclosure. In one exemplary embodiment, a light-emitting diode is coated with a luminescent material as well as one or both surfaces (of walls) in intimate contact with a volume of space of and within a second optically-transmissive enclosure. It is desirable that a second optically-transmissive enclosure "110" be a site at which a Stokes shift takes place as this site is one which generates heat to be transferred to a third enclosure and to heat an alkali metal vapor to a extent it can. If a first optically-transmissive enclosure "111" also contains a luminescent material, it is preferable that a Stokes shift for a luminescent material within a second enclosure be greater than a Stoke shift, if any, within a first enclosure.

In all the embodiments of the instant invention, there is an alkali metal within a third optically-transmissive enclosure "109". The metal may be in a solid state, liquid state and or gaseous state when a power supply to a light-emitting diode is in an off state, but when powered, then at least some of the metal comprising a volume of space within third enclosure be in a gaseous state. An alkali metal may comprise sodium, potassium, rubidium or it may comprise binary or tertiary alloys of the above alkali metals. Although it is preferable that an alkali metal within the third enclosure is not cesium, in certain embodiments of the instant invention, the binary or tertiary alloys' content may contain a minor amount of cesium, no more than 5% in composition.

Vapor cells that contain alkali metal, such as our third optically-transmissive enclosure, can be fabricated in a manner like that taught in the paper. [Eklund, et. al.], whose techniques are adoptable in the instant invention without undue experimentation. The enclosure of Eklund et. al. is designed for an atomic clock which is outside the scope of the instant invention. Although there are many variations on a theme in which alkali metal vapor can be introduced into an enclosure, in this case, Eklund et. al. teaches, for rubidium (isotope 87): $BaN_6$ and $^{87}RbCl$ are placed inside a small glass ampul with a 5 mm long nozzle of 700 μm diameter. {The RbCl can be obtained from polylithionite via alkaline leaching combined with solvent extraction as described elsewhere. [Lv, et. al., 2020]}. An ampul is then aligned with the cell opening inside a vacuum chamber and heated to react the compounds, and the nitrogen produced during the reaction is pumped away. Since the vapor pressure of a rubidium is higher than that of Ba and Cl, a fairly pure $^{87}$Rb beam emerges from the ampul and is deposited into the cell. The vacuum chamber is then filled with a desired combination of buffer gases and a cell is sealed. Usually, the buffer gas is a Noble gas and, or, Nitrogen. The barium chloride, BaCl, that remains acts as a white body radiator. In the alternative, the instant invention can be reduced to practice by an alternative loading technique: rubidium metal solid state can be placed in the ampul and closed in the same manner but then rely on heat generate during device operation to generate a vapor phase of rubidium metal. In this latter case, the instant invention uses the heat from inefficiency of electron: hole recombination and the heat generated at the site of a Stokes shift to cause a phase change of the rubidium metal. Both techniques can be used without undue experimentation to optimize filling the third enclosure to obtain an alkali metal vapor in the enclosure itself. In certain embodiments, auxiliary heating supplements that generated at the pin junction and the site of any Stokes shift. The purpose of the auxiliary heating is to be used to support the heat of vaporization of the rubidium: alkali metal alloy. Blue, violet and uv radiation can be used to supplement auxiliary heating to desorb alkali metal from the surfaces of the third enclosure adding atoms to the vapor state. [Alexandrov, et. al., 2002], [Klempt, et. al., 2006]

Another means by which rubidium atoms can be introduced is by immobilizing the atoms onto a porous glass and mounting the adsorbed glass into a third enclosure. A medium is made by compaction of ground glass grains. The shape of the interstices is random and irregular. Typical dimensions of the interstices are in a range of 1-25 μm depending on the sample. Rubidium atoms are present as vapor inside the interstice volume and also condensed onto a glass surface of the pores. The vapor phase density can be controlled through temperature. Prior to entering an atmosphere of rubidium, the compacted porous glass is heated with a flame under a vacuum while present in an enclosure to become, after assembly of a microelectronic device, the third enclosure. Thus, a wall between the second optically-transmissive enclosure and the third optically-transmissive enclosure will be brought into the microelectronic device as an enclosure in which the porous glass and rubidium vapor is already entrained. A porous glass also provides scattering of light from a p-n junction and a luminescent material. The luminescence from a rubidium element entrained within a porous glass is atomic luminescence.

The best enclosure material for an enclosure that contains an alkali metal vapor is one comprising alkali-resistant Corning 1720 aluminosilicate glass. The diffusion of alkali atoms into this glass during operation is sufficiently slow that operational lifetimes are more than decades. A suitable substitute is Schott 8436 aluminosilicate glass as well as GE-180 glass both of which offer high alkali resistivity due to their aluminosilicate composition. An aluminosilicate glass can be sealed to a support of a microelectronic device by heat or using Schott glass solder. Anodic bonding is a preferred means of making hermetic enclosures for glass walls to be sealed with semiconductor surfaces.

Anodic bonding is also called field assisted bonding or electrostatic sealing. Clean surfaces and atomic contact between the substrates is required for anodic bonding. Bonding takes place when the surfaces are placed between a chuck and the temperature is increased to just below the glass transition temperature of glass, followed by applying electric potential of several hundred volts. After reaching a certain temperature, the oxides dissociate, and alkali ions are driven into the glass by an electric field resulting in an oxygen-rich layer at the interface of the surfaces. The total bond process time is less than one hour in duration.

The fundamental theory of anodic bonding is as detailed with Daschner's work and is used to hermetic seal the primary, second and third optically-transmissive enclosures of the instant invention. A metal collar (140), which we call a heat-directing collar, around the base of the third optically-transmissive enclosure, may be used with anodic bonding to hermetically seal the enclosures and to localize any thermal energy dissipated by the p-n junction to the collar. [Daschner, 2015]. [Daschner, et. al., 2014]. Said thermal energy once localized is used to heat the alkali metal, preferably one of rubidium, even more preferably an alloy of rubidium and potassium or rubidium and sodium, to assist its vaporization within the third optically-transmissive enclosure. The heat of vaporization of rubidium metal is 16.5 kcal per mole. A Stokes shift associated with the instant invention is approximately 32 kcal per mole.

A rubidium perovskite quantum dot luminescent material is synthesized as reported elsewhere. Succinctly, for the case of $Rb^+/Mn^{2+}$ ions co-doped ($CsPbCl3:(Rb^+, Mn^{2+})$ perovskite quantum dots), different molar feed ratios of $Cs_2CO_3$ and $Rb_2CO_3$ (1/0.1, 1/0.5, 1/1, 1/3 and 1/9, respectively) are employed to prepare the cesium/rubidium-oleate solution. Briefly, $Cs_2CO_3/Rb_2CO_3$ (0.624 mmol), oleic acid (1 ml) and octadecene (10 ml) are mixed in a 50 ml three-neck flask and stirred at 120° C. under a $N_2$ atmosphere. Meanwhile, $PbCl_2$ (0.188 mmol), $MnCl_2$ (0.188 mmol), oleyl-amine (0.7 ml), oleic acid (0.7 ml), trioctylphosphine (1 ml) and octadecene (5 ml) are mixed in a 50 ml three-neck flask and filled with $N_2$. After stirring for 1 h at 120° C., the temperature is increased to 210° C. and the cesium/rubidium-oleate solution is quickly injected. Finally, the $CsPbCl_3:(Rb^+, Mn^{2+})$ perovskite quantum dots is obtained through cooling in an ice-water bath. [Na Wu, et. al., 2023]. Coating onto a surface of an enclosure wall or on top of a blue or violet LED die is accomplished dissolving polymethylmethacrylate polymer into toluene, then adding a luminescent material and coating a suspension on to the selected surfaces, followed by overnight drying with trapping of the solvent off-gas.

This rubidium containing luminescent material, not to be confused with rubidium vapor sequestered within a third optically-transmissive enclosure, may be used in second optically-transmissive enclosure and, or, maybe used as a coating on a LED die within a first optically-transmissive enclosure. This rubidium comprising luminescent material generates luminescence that is distinct and different than an alkali metal, more preferably rubidium vapor atomic luminescence generated within a third optically-transmissive enclosure, the latter being a necessary requirement of the instant invention.

Material structures are known that contain both rubidium atoms and rubidium ions complexed with surroundings atoms. By way of example, the reaction of a single crystal of fully dehydrated sodium zeolite X, $Na_{92}Si_{100}Al_{92}O_{384}$ per unit cell, with rubidium vapor at 400° C. The resultant structure comprised of 92 $Rb^+$ ions (for charge balance) and 48 rubidium neutral atoms per unit cell. By the definition of terms used herein, the aforementioned material is a luminescent material even if the emission used in the instant invention emanates from the non-ionized rubidium atoms. [Seok, et. al., 2000]

REFERENCES

Barta D J, Tibbitts T W, Bula R J, Morrow R C; "Evaluation of light emitting diode characteristics for a space-based plant irradiation source." Adv Space Res. 1992; 12(5): 141-9. [Barta, et. al., 1992-A]

Steranka, F. M. Chapter 3 AlGaAs Red Light-Emitting Diodes, Editor(s): Stringfellow, G. B. & George Craford, M., "Semiconductors and Semimetals", Elsevier, Volume 48, 1997, Pages 65-96. [Steranka, 1997.]

Holonyak Jr., N., & Bevacqua, S. F. (1962). "Coherent (visible) light emission from Ga $(As_{1-x}P_x)$ junctions." Applied Physics Letters, 1(4), 82-83. [Holonyak Jr. et. al., 1962.]

McCree, K. J. "The action spectrum, absorptance and quantum yield of photosynthesis in crop plants", Agricultural Meteorology, Volume 9, 1971, Pages 191-216. [McCree, 1971.]

Vernon, L. P. and Seely, G. R. (Eds.), "The chlorophylls", Academic Press, New York 1966. [Vernon, et. al., 1966.]

Lysenko, V., Varduny, T., Simonovich, E., Chugueva, O., Chokheli, V., Sereda, M., Gorbov, S., Krasnov, V., Tarasov, E., Sherstneva, I., and Kozlova, M. (2014). "Far-Red Spectrum of Second Emerson Effect: A Study Using Dual-Wavelength Pulse Amplitude Modulation Fluorometry." American Journal of Biochemistry and Biotechnology. 10. 234-240. [Lysenko, et. al., 2014.]

Hoenecke M. E., Bula R. J., and Tibbitts T. W.; "Importance of 'blue' photon levels for lettuce seedlings grown under red-light-emitting diodes." HortScience. 1992 May; 27(5):427-30. [Hoenecke, et. al., 1992.]

Bula R. J., Morrow R. C., Tibbitts T. W., Barta D. J., Ignatius R. W., and Martin T. S.; "Light-emitting diodes as a radiation source for plants"; HortScience. 1991 February; 26(2):203-5. [Bula, et. al., 1991]

Janda M, Navrátil O, Haisel D, Jindřichová B, Fousek J, Burketová L, Čeřovská N, and Moravec T; "Growth and stress response in *Arabidopsis thaliana, Nicotiana benthamiana, Glycine max, Solanum tuberosum* and *Brassica napus* cultivated under polychromatic LEDs"; Plant Methods. 2015 Apr. 30. [Janda, et. al., 2015.]

Cope K R, Bugbee B., Spectral effects of three types of white light-emitting diodes on plant growth and development: absolute versus relative amounts of blue light. HortScience Publication Am Soc Horticultural Sci. 2013; 48:504-9. [Cope et. Al., 2013]

Folta K M, Maruhnich S A., Green light: a signal to slow down or stop. J Exp Bot. 2007; 58:3099-111. [Folta, et. al., 2007]

Thekla von Bismarck, Kübra Korkmaz, Jeremy Ruß, Kira Skurk, Elias Kaiser, Viviana Correa Galvis, Jeffrey A. Cruz, Deserah D. Strand, Karin Köhl, Jürgen Eirich, Iris Finkemeier, Peter Jahns, David M. Kramer, Ute Armbruster. Light acclimation interacts with thylakoid ion transport to govern the dynamics of photosynthesis in *Arabidopsis*. New Phytologist, 2022; 237. [von Bismarck et. al., 2022]

Wang C, Yamamoto H, Narumiya F, Munekage Y N, Finazzi G, Szabo I, Shikanai T. Fine-tuned regulation of the K+/H+ antiporter KEA3 is required to optimize photosynthesis during induction. Plant J. 2017 February; 89(3): 540-553. [Wang, 2017.]

Mitchell, C. A. (2015). Academic Research Perspective of LEDs for the Horticulture Industry, HortScience, 50(9), 1293-1296. Retrieved Jan. 7, 2023, [Mitchell, 2015]

von Lintig J, Kiser P D, Golczak M, Palczewski K. "The biochemical and structural basis for trans-to-cis isomerization of retinoids in the chemistry of vision." Trends Biochem Sci. 2010 July; 35(7):400-10. [von Lintig, et. al., 2010.]

Cai X, Conley S M, Naash M I. RPE65: role in the visual cycle, human retinal disease, and gene therapy. Ophthalmic Genet. 2009 June; 30(2):57-62. [Cai, et. al., 2009.]

Kim S R, Fishkin N, Kong J, Nakanishi K, Allikmets R, Sparrow J R. Rpe65 Leu450Met variant is associated with reduced levels of the retinal pigment epithelium lipofuscin fluorophores A2E and iso-A2E. Proc Natl Acad Sci USA. 2004 Aug. 10; 101(32):11668-72. [Kim, et. al.]

Curtis, S., "Cosmic Alchemy", Scientific American, January 2023, page 30. [Curtis, 2023.]

S. Millman and M. Fox, Nuclear Spins and Magnetic Moments of Rb 85 and Rb 87, Phys. Rev. 50, 220 (1936). [Millman, et. al., 1936]

Fahey, Donald & Noel, Michael. (2011). Excitation of Rydberg states in rubidium with near infrared diode lasers. Optics express. 19. 17002-12. [Fahey, et. al., 2011]

Sansonetti, J. E., "Wavelengths, Transitions Probabilities, and Energy Levels for the Spectra of Rubidium (Rb I through Rb XXXVII)"; J. Phys. Chem. Ref. Data, Vol. 35, No. 1, 2006; page 301. [Sansonetti, 2006]

Jackson, D. A., The Hyperfine Structure of the Lines of the Arc Spectrum of Rubidium, Proceedings of the Royal Society of London. Series A, Containing Papers of a Mathematical and Physical Character Vol. 139, No. 839 (Mar. 3, 1933), pp. 673-682 [Jackson, 1933]

Julien Kluge, "Direct Optical Spectroscopy of the 6P manifold in rubidium", submitted Sep. 25, 2019 Sep. 25, 2019 to the Humboldt-Universitat zu Berlin, Faculty of Mathematics and Natural Sciences, Department of Physics. [Kluge, 2019]

Nakajima, T., Isobe, M., Tsuchiya, T. et al. Direct fabrication of metavanadate phosphor films on organic substrates for white-light-emitting devices. Nature Mater 7, 735-740 (2008). [Nakajima, et. al., 2008]

Na Wu1, Yue Zhai2,1, Peng Chang1, Hang Mei1, Ziyan Wang1, Hong Zhang1, Qiangqiang Zhu1, Pei Liang1 and Le Wang2,1, Rubidium ions doping to improve the photoluminescence properties of Mn doped CsPbCl3 perovskite quantum dots, 2023 Nanotechnology 34 145701. [Na Wu, et. al., 2023]

Niedzwiedzki, D. M., Mulrow, D., and Sobotka, L. G., "Evaluation of the Photophysical Properties of Two Scintillators: Crystalline Para-terphenyl and Plastic-Embedded 2,5-Diphenyloxazole Dye (EJ-276) at Room and Cryogenic Temperatures", J. Phys. Chem. A 2022, 126, 32, 5273-5282. [Niedzwiedzki, et. al., 2022]

Relman A. S. The physiological behavior of rubidium and cesium in relation to that of potassium. Yale J Biol Med. 1956 December; 29(3):248-62. [Relman, A. S., 1956]

Yubo Liu, Baozhong Ma, Yingwei Lv, Chengyan Wang, Yongqiang Chen, Thorough extraction of lithium and rubidium from lepidolite via thermal activation and acid leaching, Minerals Engineering, Volume 178, 2022, 107407 [Liu, et. al., 2022]

Goates, J. Rex, and Ott, J. Bevan. 1969. "Solid-Liquid Phase Equilibria in the Sodium-Rubidium Alloy System". United States. [Goates, et. al., 1969]

Delawarde, Elisabeth M., "Solid-liquid phase equilibria of the potassium-rubidium and rubidium-cesium alloy systems", A Thesis Presented to the Department of Chemistry Brigham Young University, May, 1971. [Delawarde, 1971]

Ott, J. B. et al. "Solid+liquid phase equilibria in the ternary alloy: sodium+potassium+rubidium." The Journal of Chemical Thermodynamics 5 (1973): 143-145. [Ott, et. al., 1973]

Goates, J. Rex, J. Bevan Ott and Chen C. Hsu. "Solid-liquid phase equilibria in the sodium-rubidium alloy system." Transactions of The Faraday Society 66 (1970): 25-29. [Goates, et. al., 1970]

Ham, Norman S., and A. Walsh. "Potassium and rubidium Raman lamps." The Journal of Chemical Physics 36.4 (1962): 1096-1097 [Ham, et. al., 1962]

Yun Yang, Xiaoyu Dong, Shilie Pan, and Hongping Wu, The Rubidium Barium Borate Resulting from $B_7O_{15}$ Fundamental Building Block Exhibits DUV Cutoff Edge, Inorg. Chem. 2018, 57, 21, 13380-13385. [Yang, et. al., 2018]

Steven P. DenBaars, Daniel Feezell, Katheryn Kelchner, Siddha Pimputkar, Chi-Chen Pan, Chia-Chen Yen, Shinichi Tanaka, Yuji Zhao, Nathan Pfaff, Robert Farrell, Mike Iza, Stacia Keller, Umesh Mishra, James S. Speck, Shuji Nakamura, "Development of gallium-nitride-based light-emitting diodes (LEDs) and laser diodes for energy-efficient lighting and displays", Acta Materialia 61 (2013) 945-951. [DenBaars, et. al., 2013]

Górecki K, Ptak P, Torzewicz T, Janicki M. Influence of a Thermal Pad on Selected Parameters of Power LEDs. Energies. 2020; 13(14):3732. [Górecki, et. al., 2020]

Eklund, E. J., Shkel, A. M., Knappe, S., Donley, E., and Kitching, J., "Spherical Rubidium Vapor Cells Fabricated by Micro Glass Blowing", MEMS 2007, Kobe, Japan, 21-25 Jan. 2007. [Eklund, et. al.]

Yingwei Lv, Peng Xing, Baozhong Ma*, Yubo Liu, Chengyan Wang*, Wenjuan Zhang, and Yongqiang Chen, Efficient Extraction of Lithium and Rubidium from Polylithionite via Alkaline Leaching Combined with Solvent Extraction and Precipitation ACS Sustainable Chem. Eng. 2020, 8, 38, 14462-14470, Publication Date: Sep. 3, 2020 [Lv, et. al., 2020]

E. B. Alexandrov, M. V. Balabas, D. Budker, D. English, D. F. Kimball, C.-H. Li, and V. V. Yashchuk, Light-induced desorption of alkali-metal atoms from paraffin coating, Phys. Rev. A 66, 042903—Published 23 Oct. 2002; Erratum Phys. Rev. A 70, 049902 (2004). [Alexandrov, et. al., 2002]

C. Klempt, T. van Zoest, T. Henninger, O. Topic, E. Rasel, W. Ertmer, and J. Arlt, Ultraviolet light-induced atom desorption for large rubidium and potassium magneto-optical traps, PHYSICAL REVIEW A 73, 013410, 2006. [Klempt, et. al., 2006]

R. Daschner, H. Kübler, R. Löw, H. Bauer, N. Frühauf, and T. Pfau. Triple stack glass-to-glass anodic bonding for optogalvanic spectroscopy cells with electrical feedthroughs. Appl. Phys. Lett., 105:041107, 2014. [Daschner, et. al., 2014]

Renate Daschner, "Addressable Rubidium vapor cells for optical and electrical read-out of Rydberg excitations", Doktors der Naturwissenschaften Thesis, Physikalisches Institut der Universität Stuttgart, 2015. [Daschner, 2015]

Na Wu et al 2023 Nanotechnology 34 145701 [Na Wu, et al., 2023]

Seok Hee Lee, Yang Kim, and Karl Seff, "A Cationic Rubidium Continuum in Zeolite X", J. Phys. Chem. B 2000, 104, 47, 11162-11167. [Seok, et. al., 2000]

Jack Porter Stone, Curtis T. Ewing, R. L. Karp, J. R. Spann, and Roman Rodney Miller, "Predicted high-temperature properties of rubidium", J. Chem. Eng. Data 1967, 12, 3, 352-356. [Stone, et. al.; 1967]

The invention claimed is:

1. A microelectronic device, comprising:
   at least one of a light emitting diode with a p-n junction operable to emit radiation, a primary radiation, when coupled with a power source;
   a first optically-transmissive enclosure the boundaries of which contain an interior space within which are said light-emitting diode or diodes;
   a second optically-transmissive enclosure the boundaries of which contain an inner space, and which said second optically-transmissive enclosure comprises a luminescent material which provides luminescence, a second radiation, from said luminescent material, in a receiving relationship with primary radiation;
   at least one third optically-transmissive enclosure the boundaries of which comprise an outermost space, within which are nested said second enclosure within which is nested said first enclosure, and a rubidium element, or an alkali metal alloy comprised partially of said rubidium element, within said outermost space;
   further comprising said rubidium element operable to vaporize or sublime said rubidium element into a rubidium vapor state of matter within said outermost space;
   further comprising said rubidium vapor in a receiving relationship with primary radiation, to emit radiation, a tertiary radiation, visible to a human observer bathochromic to primary radiation;
   further comprising said rubidium vapor in a receiving relationship with thermal energy from the p-n junction, a site of primary radiation, and or from a site of second radiation.

2. A device of claim 1, comprising a heat-directing collar.

3. A device of claim 1, comprising a luminaire within which is said first optically-transmissive enclosure, said second optically transmissive enclosure, and said third optically transmissive enclosure.

4. A device of claim 1, comprising at least one optically-transmissive enclosure comprising a luminescent element entrained within the walls of at least one optically-transmissive said enclosures.

5. A device of claim 2, comprising a luminaire within which is said first optically-transmissive enclosure, said second optically transmissive enclosure, and said third optically transmissive enclosure.

6. A device of claim 2, comprising at least one optically-transmissive enclosure comprising a luminescent element entrained within the walls of at least one optically-transmissive said enclosures.

7. A device of claim 1, comprising luminescent material that emits said tertiary radiation at 780 nm, 794 nm, 421 nm or 420 nm.

8. A device of claim 1, comprising said rubidium element isotope 85Rb.

9. A device of claim 1, comprising said rubidium element isotope 87Rb.

10. A device of claim 2, comprising one of said rubidium element 85Rb or 87Rb.

11. A device of claim 5, comprising one of said rubidium element 85Rb or 87Rb.

12. A device of claim 10 comprising deep red luminescence.

13. A device of claim 11 comprising deep red luminescence.

14. A device of claim 1 comprising a heat-generating Stokes shift.

15. A device of claim 1 comprising a heat generating p-n junction.

16. A device of claim 1 comprising, when coupled with said power source, radiative lifetimes between 5.5 nanoseconds and 29.4 nanoseconds.

17. A device of claim 1 comprising said third enclosure operating under a vacuum or partial vacuum.

18. A device of claim 17 comprising a single atom of said rubidium element is excited by said primary radiation.

19. A device of claim 18 comprising a single atom of said rubidium element is excited by said second radiation.

20. A device of claim 1 comprising a magnetic field greater than that of the Earth magnetic field.

* * * * *